(12) United States Patent
Manda

(10) Patent No.: US 11,804,561 B2
(45) Date of Patent: Oct. 31, 2023

(54) LIGHT RECEIVING ELEMENT, METHOD OF MANUFACTURING LIGHT RECEIVING ELEMENT, AND IMAGING APPARATUS

(71) Applicant: Sony SemiConductor Solutions Corporation, Kanagawa (JP)

(72) Inventor: Shuji Manda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 148 days.

(21) Appl. No.: 17/440,939

(22) PCT Filed: Feb. 21, 2020

(86) PCT No.: PCT/JP2020/007047
§ 371 (c)(1),
(2) Date: Sep. 20, 2021

(87) PCT Pub. No.: WO2020/189179
PCT Pub. Date: Sep. 24, 2020

(65) Prior Publication Data
US 2022/0165896 A1  May 26, 2022

(30) Foreign Application Priority Data
Mar. 20, 2019  (JP) .................. 2019-052687

(51) Int. Cl.
*H01L 31/0352* (2006.01)
*H01L 27/146* (2006.01)
(Continued)

(52) U.S. Cl.
CPC ............ *H01L 31/035236* (2013.01); *H01L 27/14601* (2013.01); *H01L 31/03529* (2013.01); *H01L 31/1075* (2013.01); *H01L 31/186* (2013.01)

(58) Field of Classification Search
CPC ....... H01L 31/035236; H01L 27/14601; H01L 31/03529; H01L 31/1075; H01L 21/28;
(Continued)

(56) References Cited

U.S. PATENT DOCUMENTS 4,992,386 A  2/1991  Furuyama et al.
5,144,381 A  9/1992  Furuyama et al.
(Continued)

FOREIGN PATENT DOCUMENTS

JP  S57159072 A  10/1982
JP  H01144687 A  6/1989
(Continued)

OTHER PUBLICATIONS

Keiichi (JP 2001-274451) machine translation (Year: 2001).*
International Search Report dated Apr. 14, 2020 in connection with PCT/JP2020/007047.

*Primary Examiner* — Yasser A Abdelaziez
(74) *Attorney, Agent, or Firm* — K&L Gates LLP

(57) ABSTRACT

A light receiving element (1) according to an embodiment of the present disclosure includes: a semiconductor layer including a compound semiconductor material; a first impurity diffusion region (12A) provided on one surface of the semiconductor layer; and a second impurity diffusion region (12B) provided around the first impurity diffusion region (12A). The second impurity diffusion region (12B) has a lower impurity concentration than an impurity concentration of the first impurity diffusion region (12A).

16 Claims, 24 Drawing Sheets

(51) Int. Cl.
*H01L 31/107* (2006.01)
*H01L 31/18* (2006.01)

(58) Field of Classification Search
CPC . H01L 21/3205; H01L 21/768; H01L 23/522; H01L 27/146; H01L 31/186; H01L 29/417; H01L 31/107
See application file for complete search history.

(56) References Cited

U.S. PATENT DOCUMENTS

| | | |
|---|---|---|
| 2007/0096236 A1 | 5/2007 | Yagyu et al. |
| 2010/0148292 A1* | 6/2010 | Minamio .......... H01L 27/14618 257/466 |
| 2011/0053310 A1* | 3/2011 | Yonezawa .......... H01L 31/0236 257/E31.032 |
| 2012/0068295 A1 | 3/2012 | Gravrand et al. |
| 2016/0190307 A1* | 6/2016 | Kagawa .............. H01L 29/0615 257/77 |
| 2017/0287898 A1* | 10/2017 | Morita ............ H01L 21/823807 |
| 2018/0261641 A1* | 9/2018 | Maruyama .............. G01J 5/045 |
| 2019/0157323 A1 | 5/2019 | Ogi et al. |

FOREIGN PATENT DOCUMENTS

| | | |
|---|---|---|
| JP | H02159775 A | 6/1990 |
| JP | H09232617 A | 9/1997 |
| JP | 2001274451 A | 10/2001 |
| JP | 2007080920 A | 3/2007 |
| JP | 2012069941 A | 4/2012 |
| KR | 101393083 B1 | 5/2014 |
| WO | 2018174090 A1 | 9/2018 |

\* cited by examiner

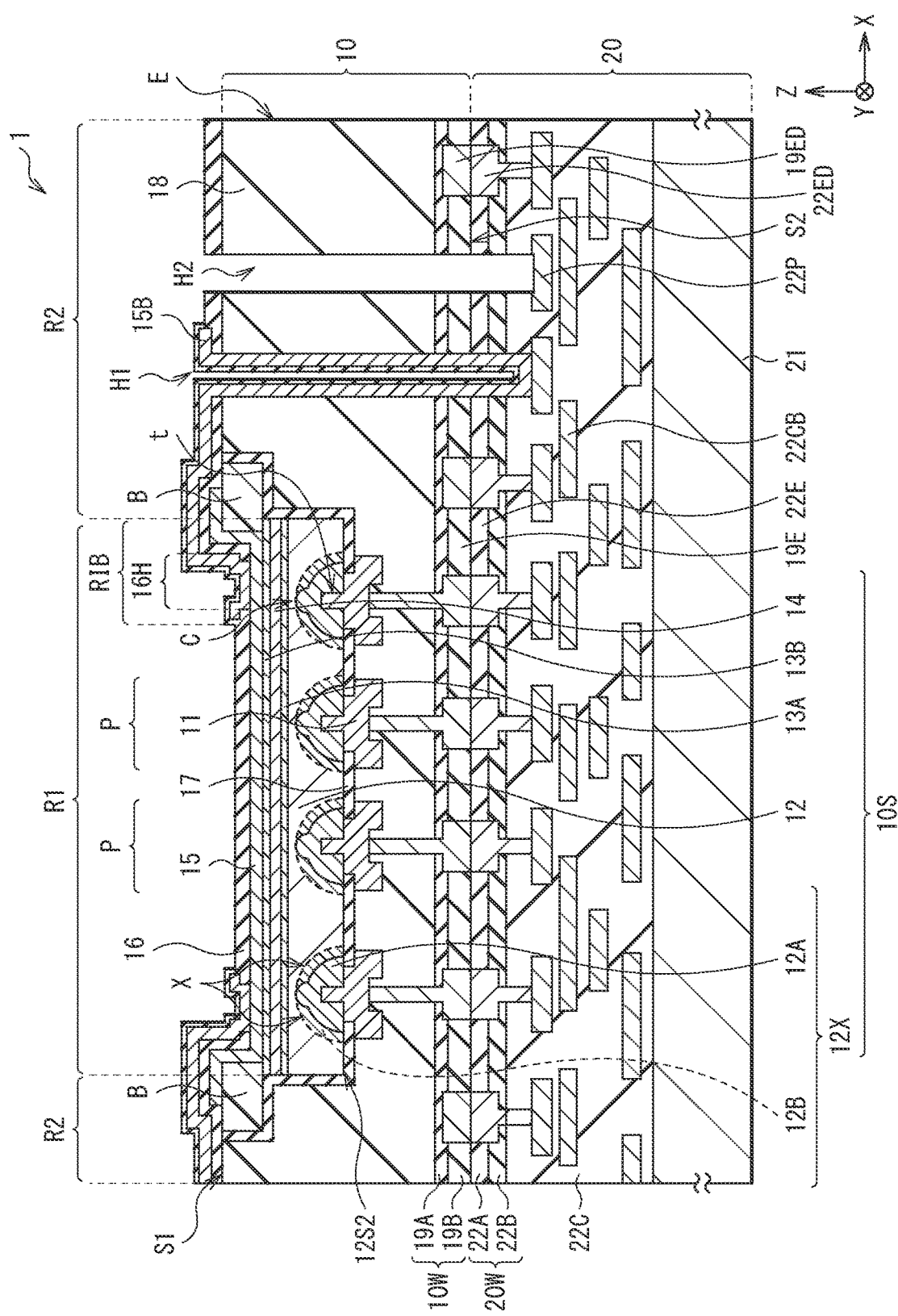
[FIG. 1]

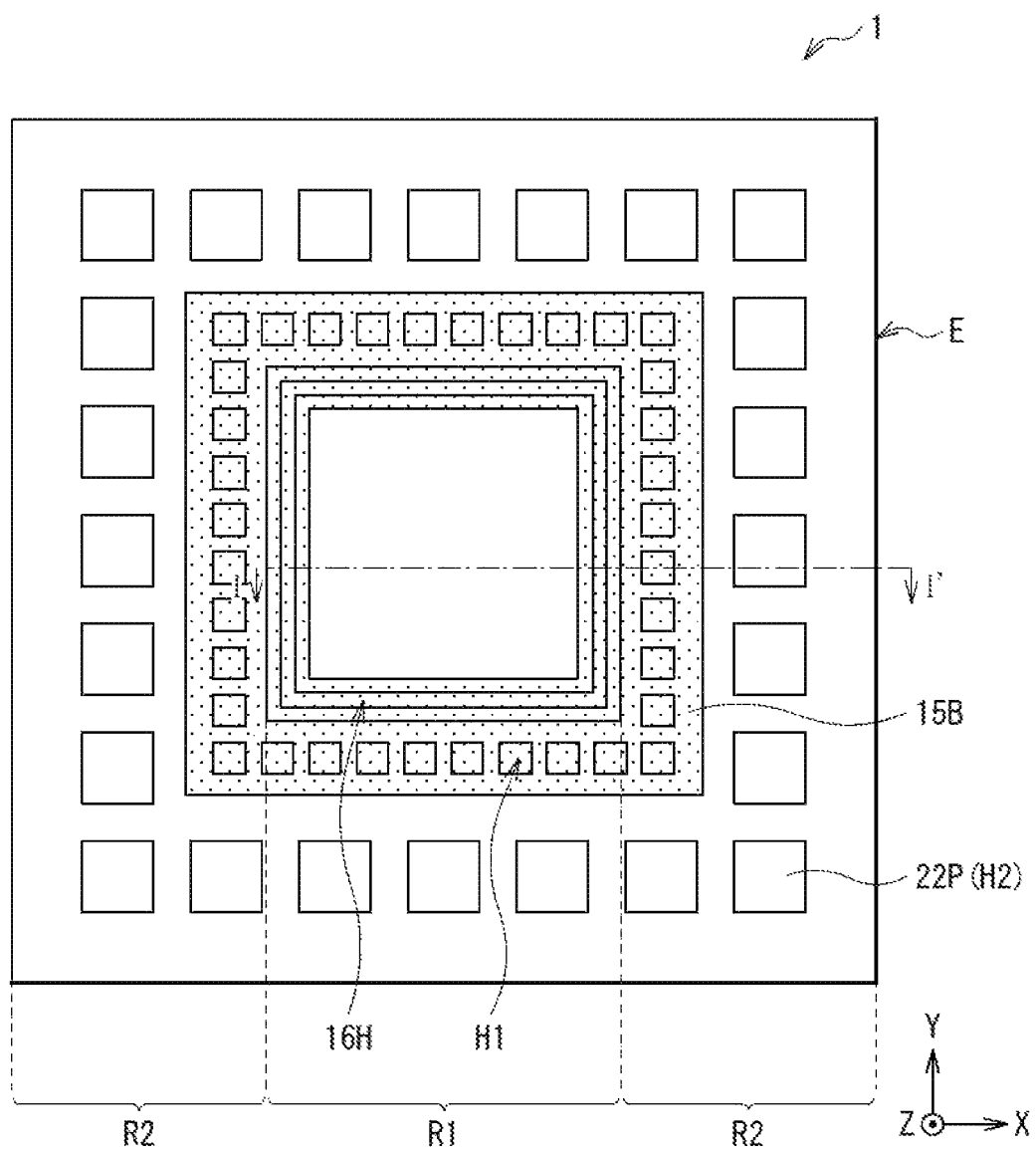
[FIG. 2]

[ FIG. 3A ]
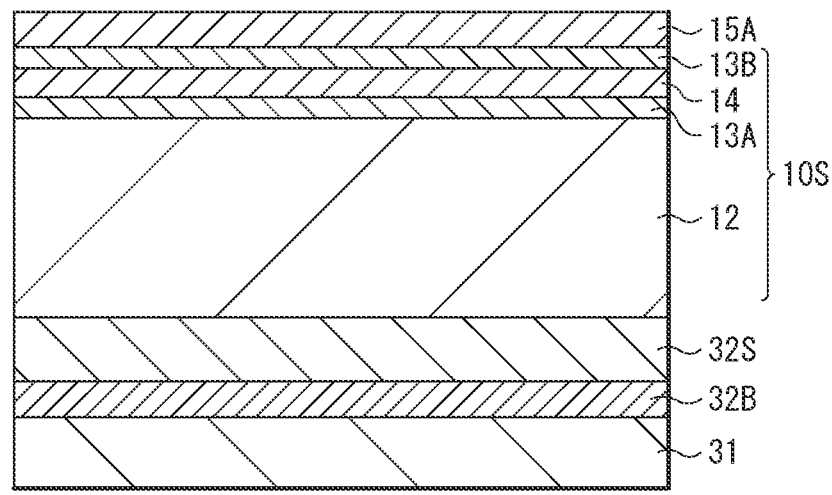
[ FIG. 3B ]
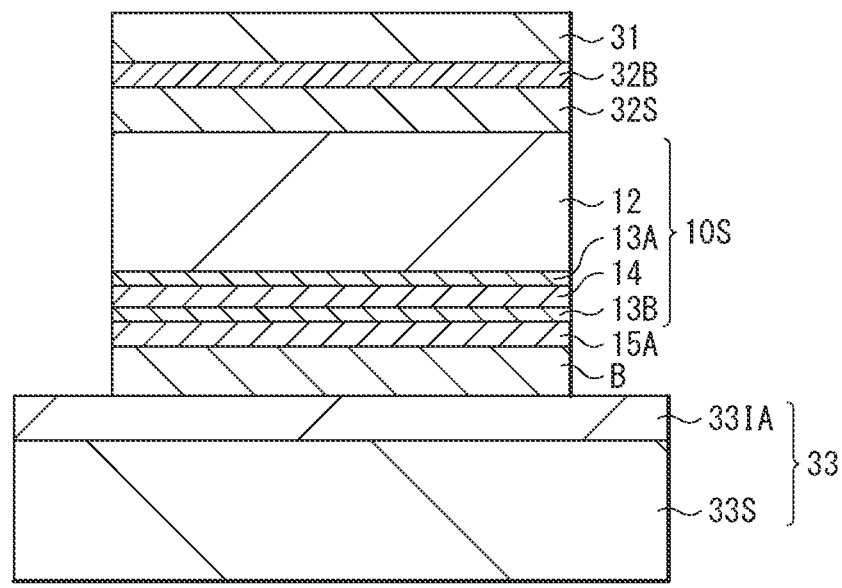

[ FIG. 3C ]
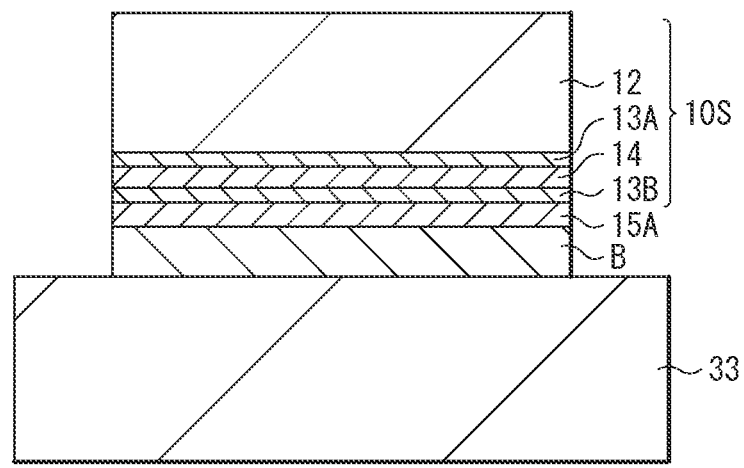
[ FIG. 3D ]
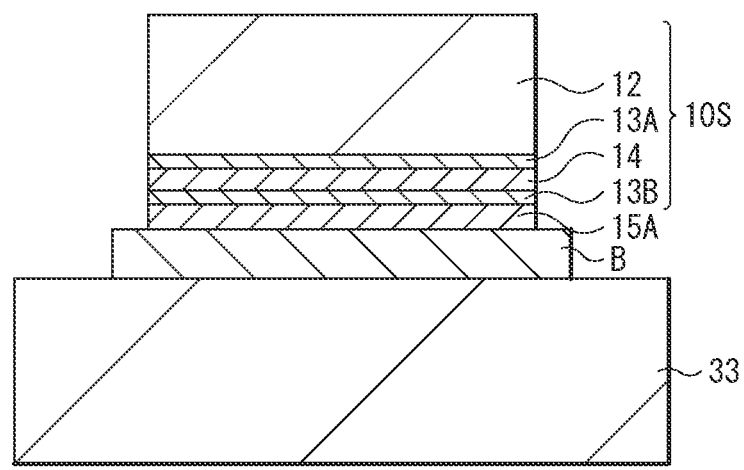

[FIG. 3E]
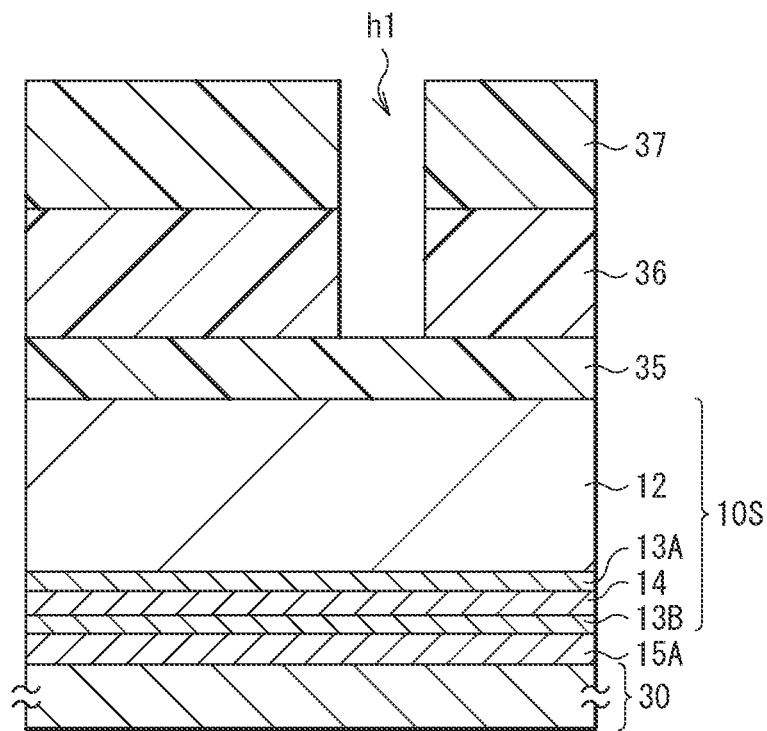
[FIG. 3F]
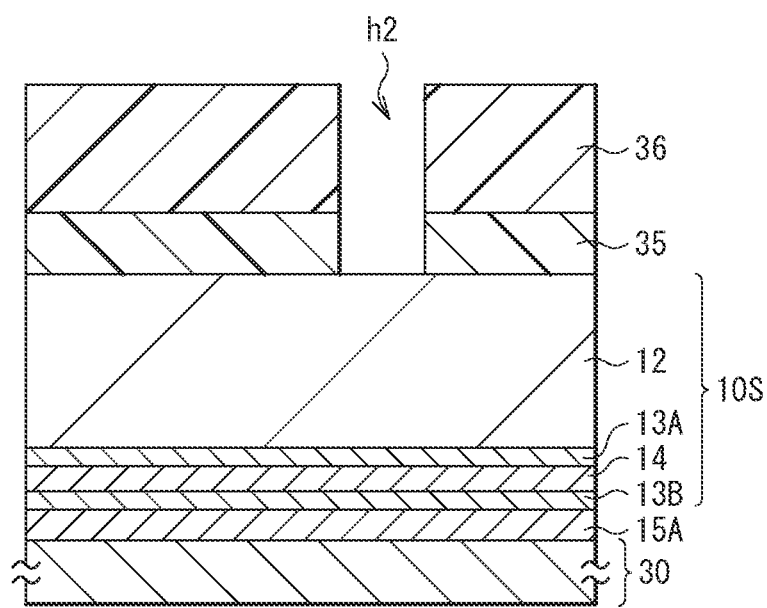

[ FIG. 3G ]
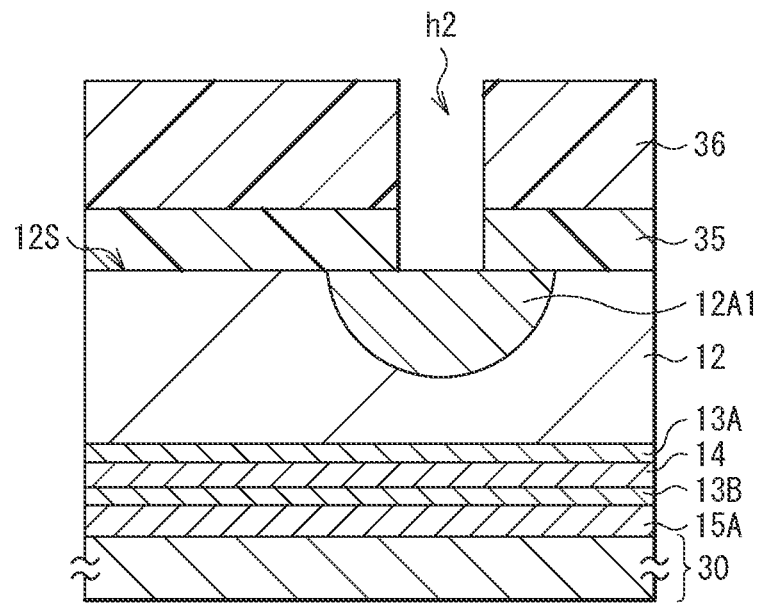
[ FIG. 3H ]
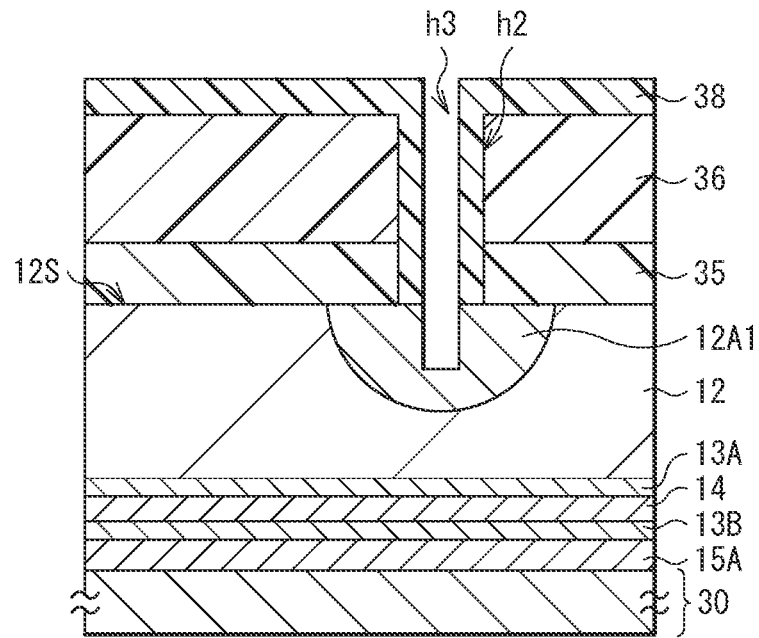

[FIG. 3I]
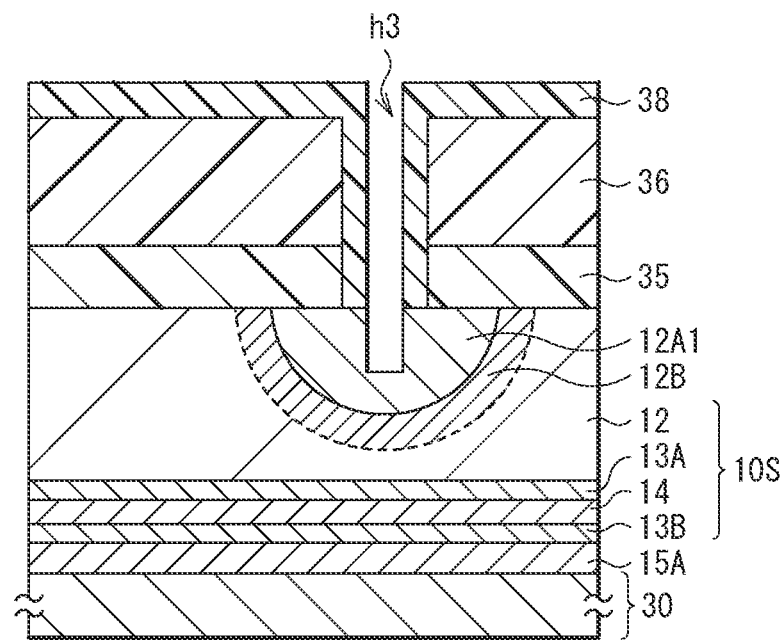
[FIG. 3J]
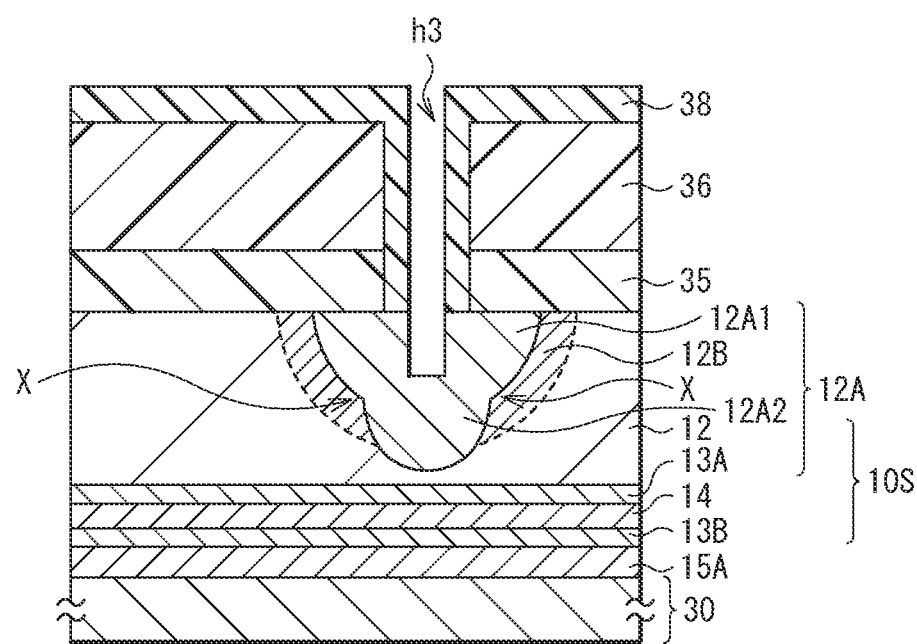

[FIG. 3K]
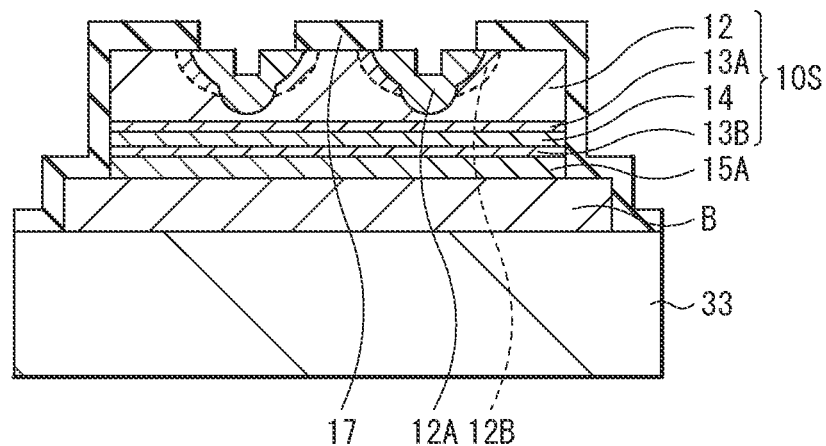
[FIG. 3L]
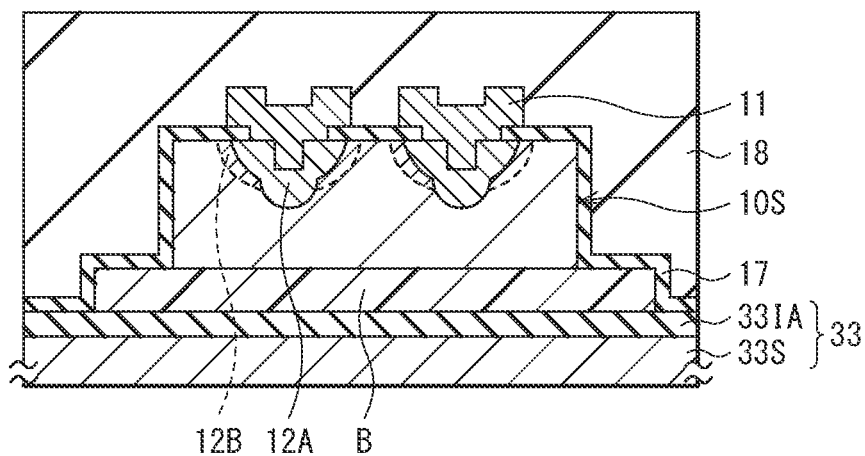
[FIG. 3M]
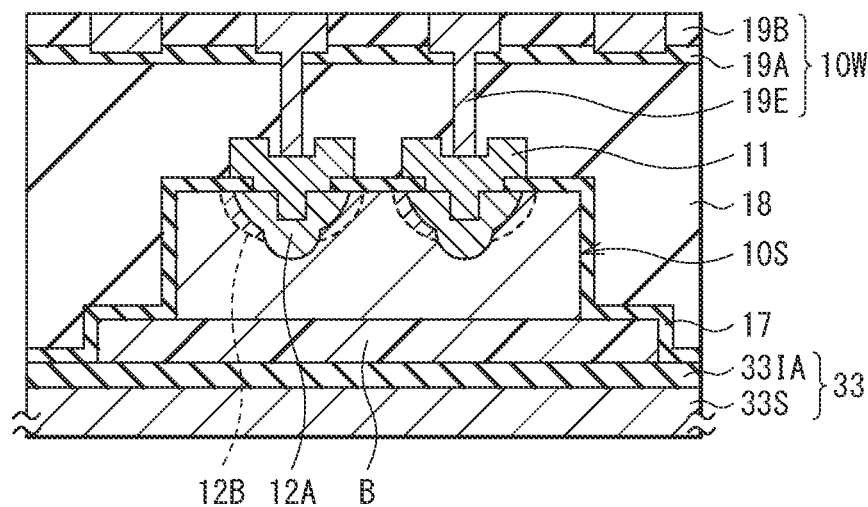

[FIG. 3N]
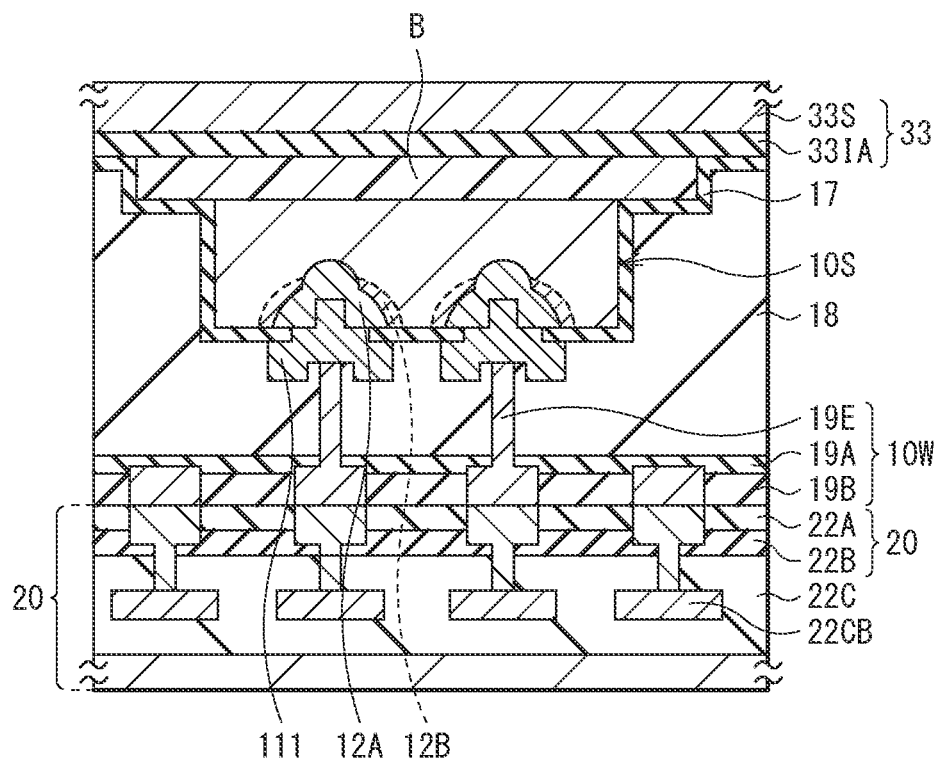
[FIG. 3O]
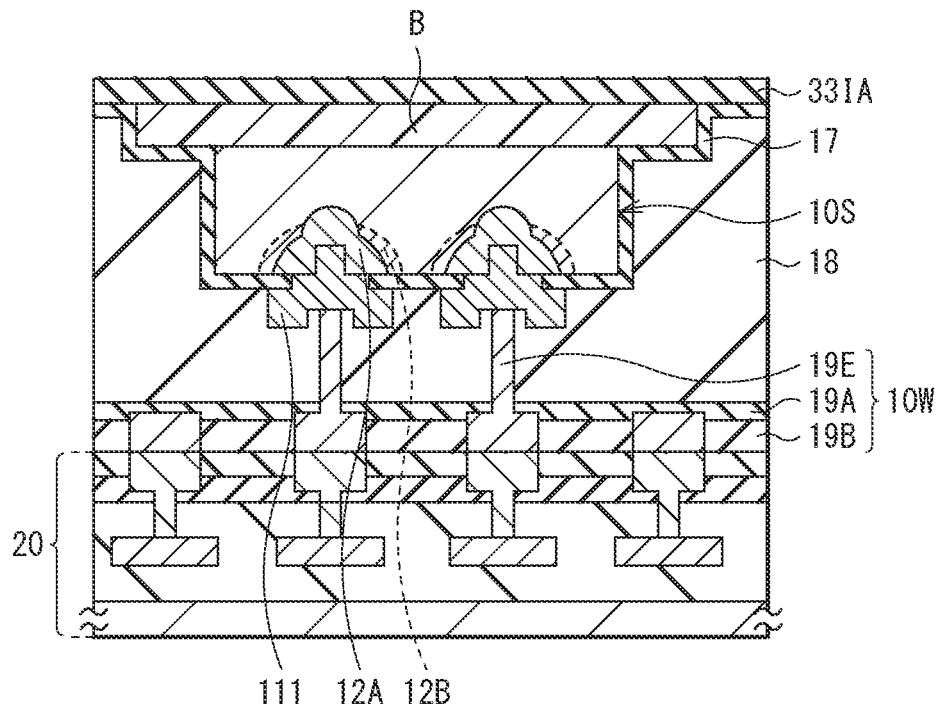

[ FIG. 3P ]
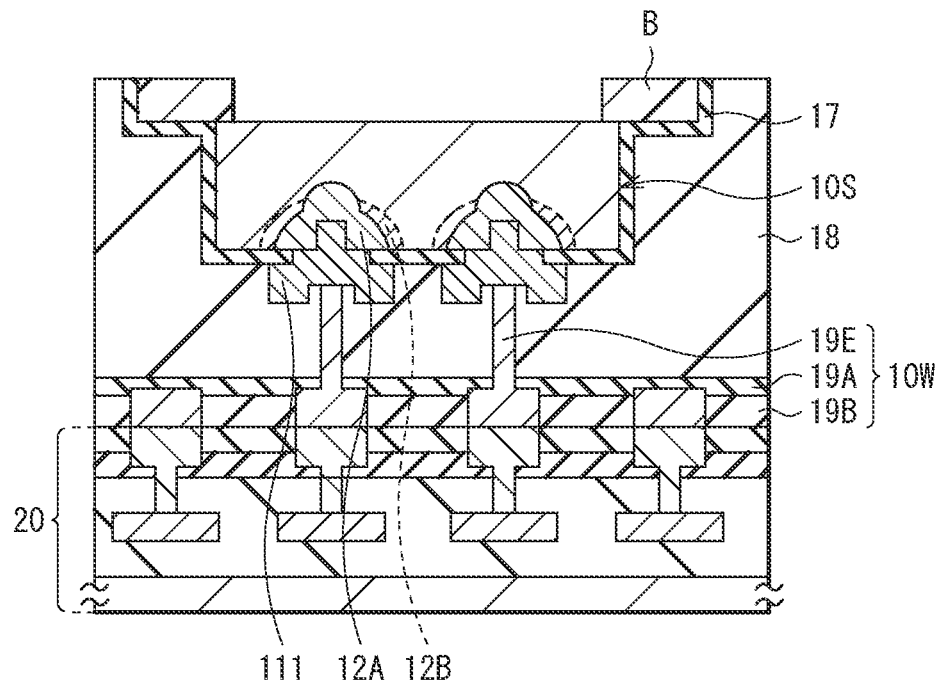
[ FIG. 3Q ]
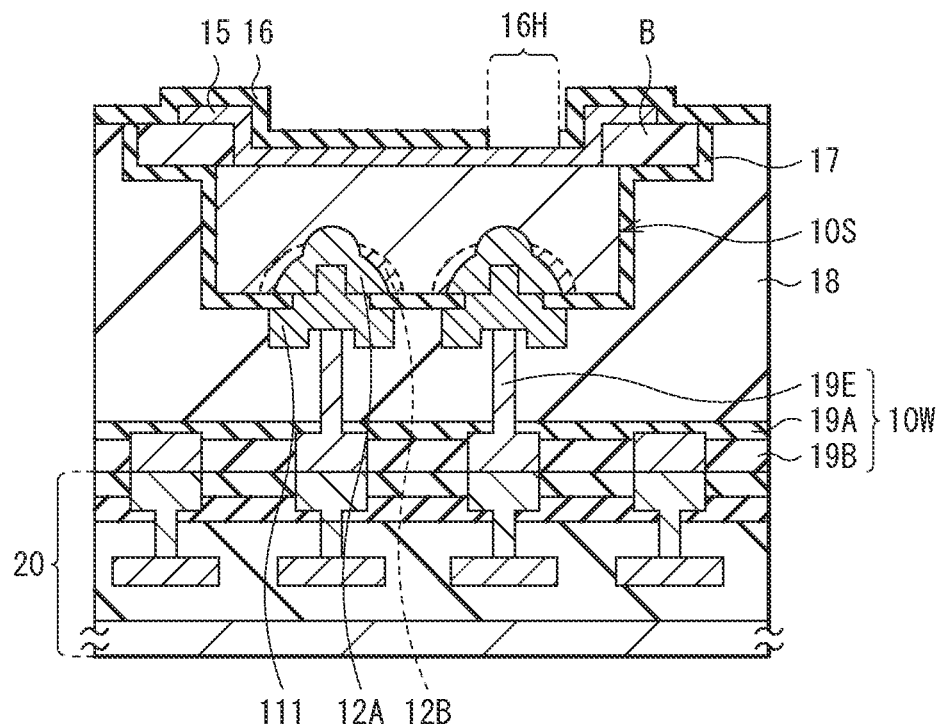

[FIG. 3R]
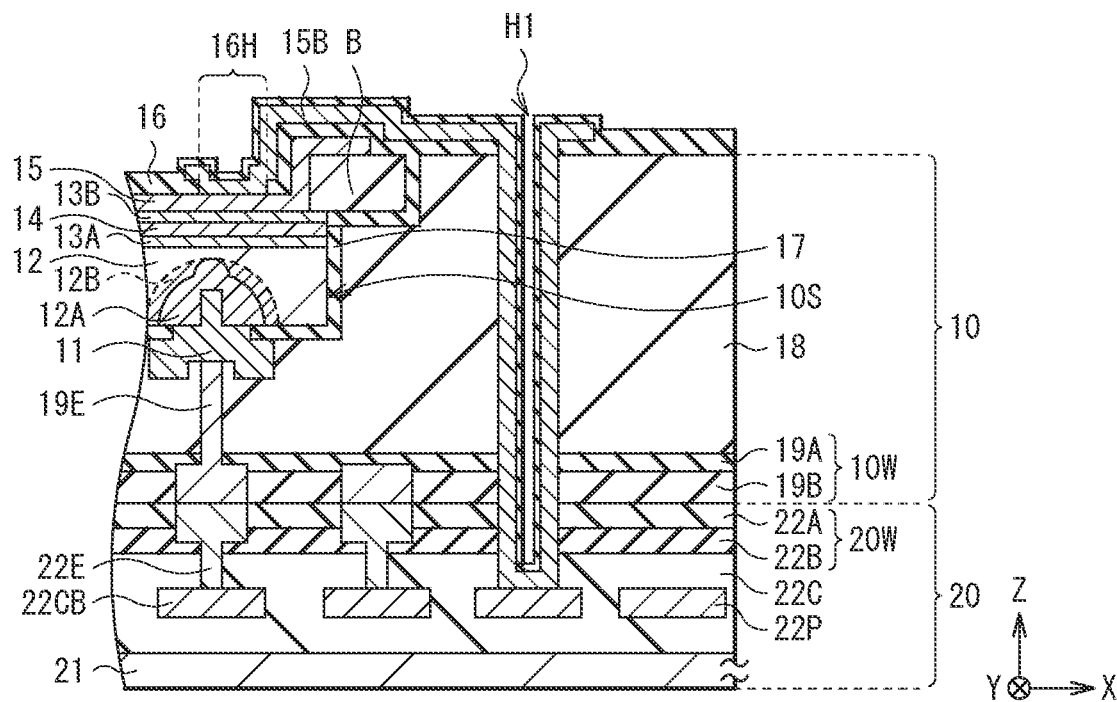
[FIG. 3S]
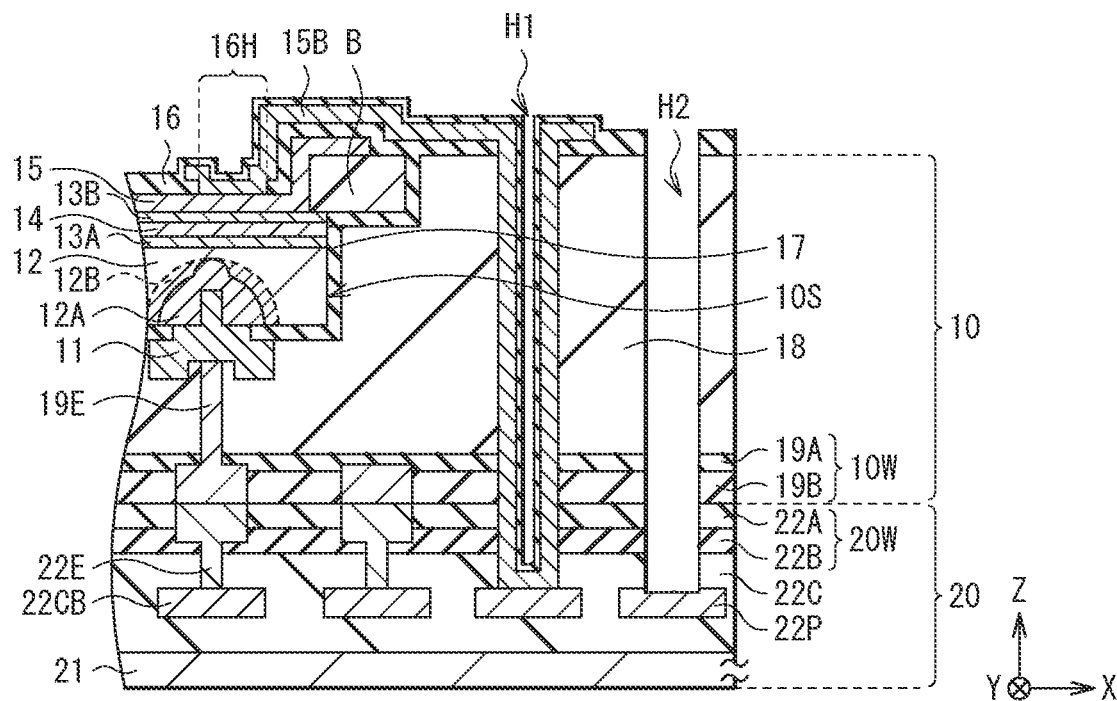

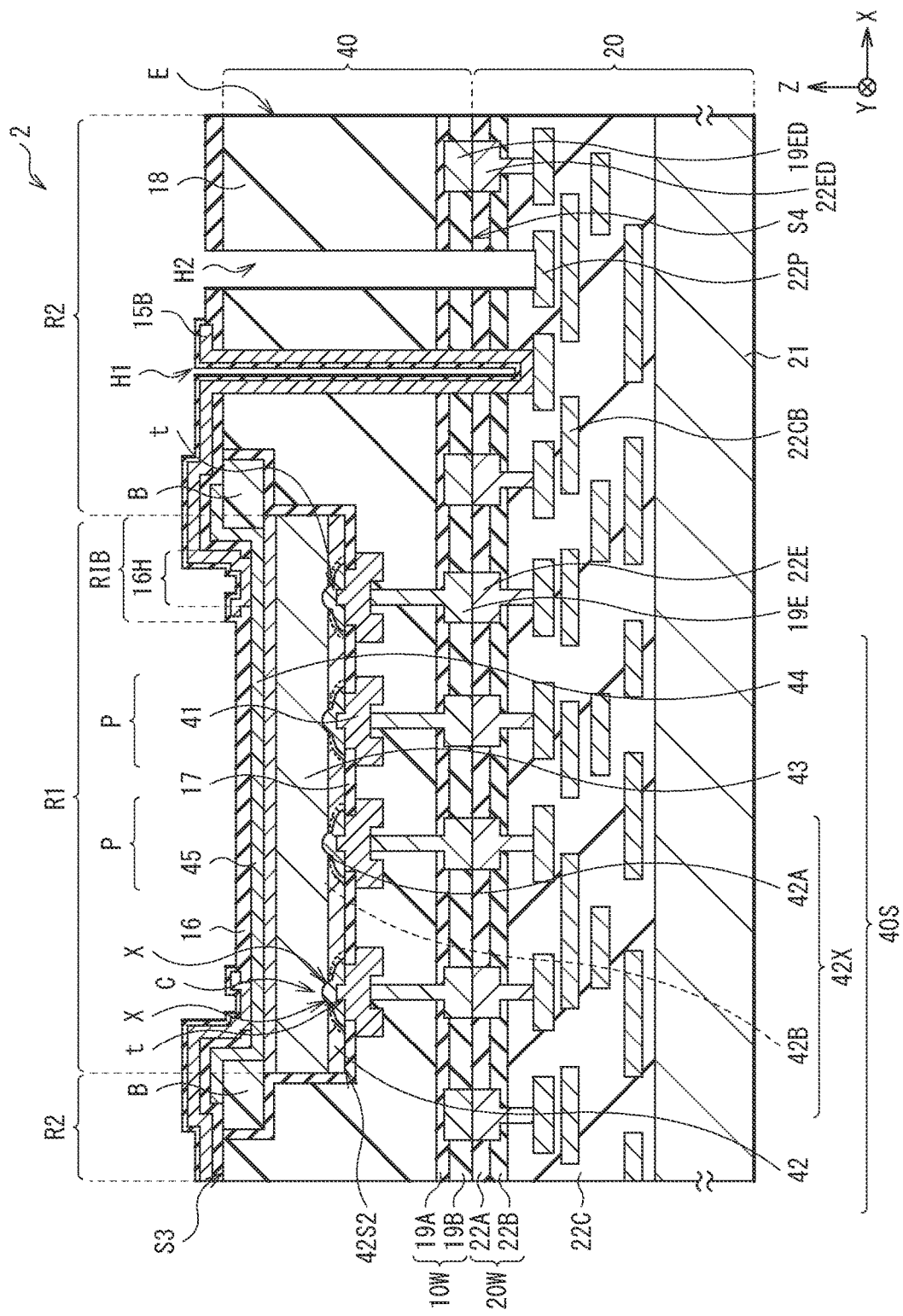
[FIG. 4]

[FIG. 5]
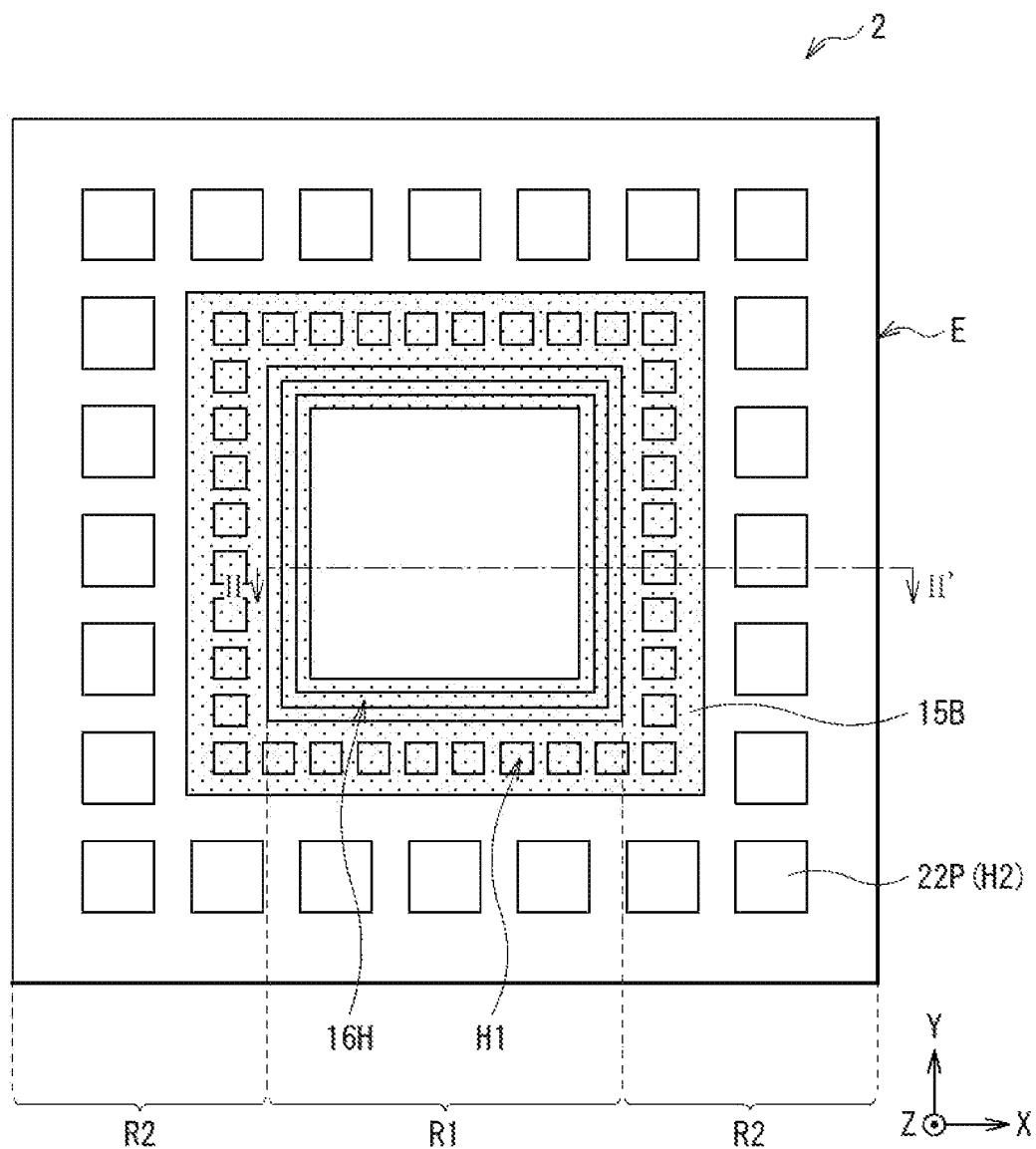

[FIG. 6]
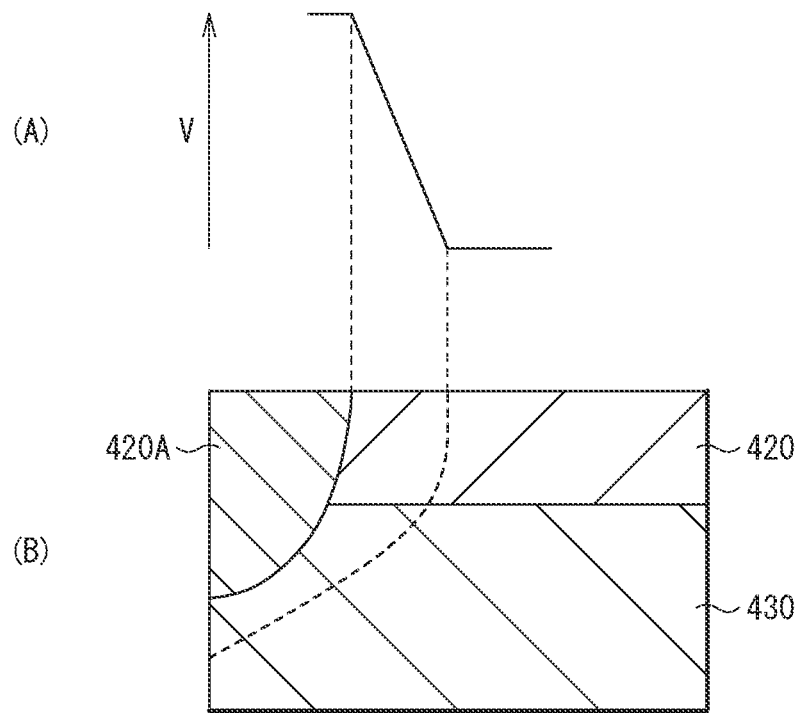
[FIG. 7]
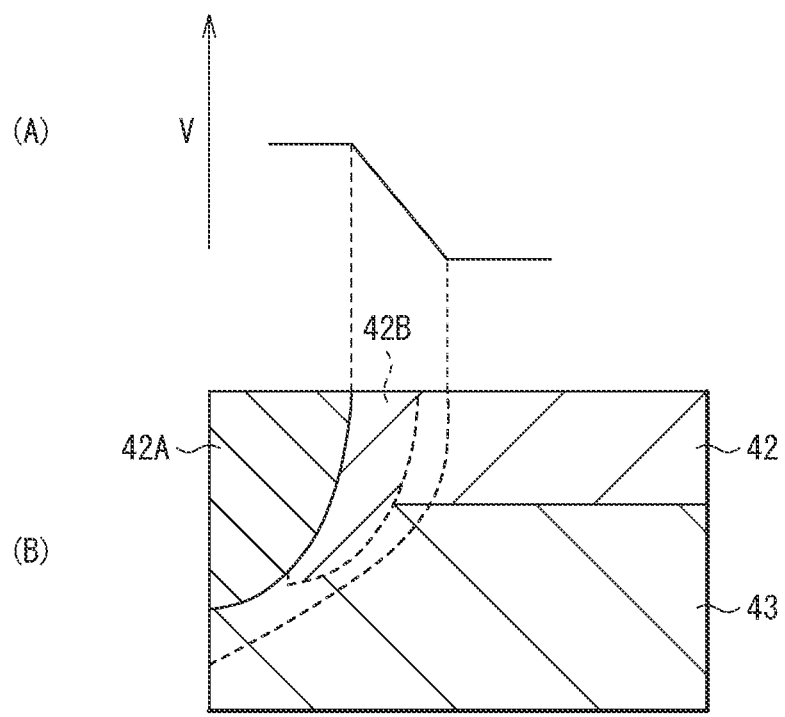

[ FIG. 8A ]
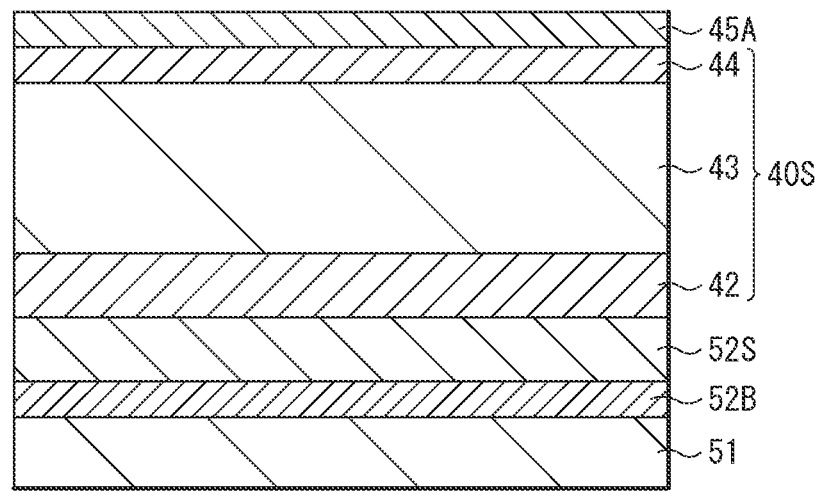
[ FIG. 8B ]
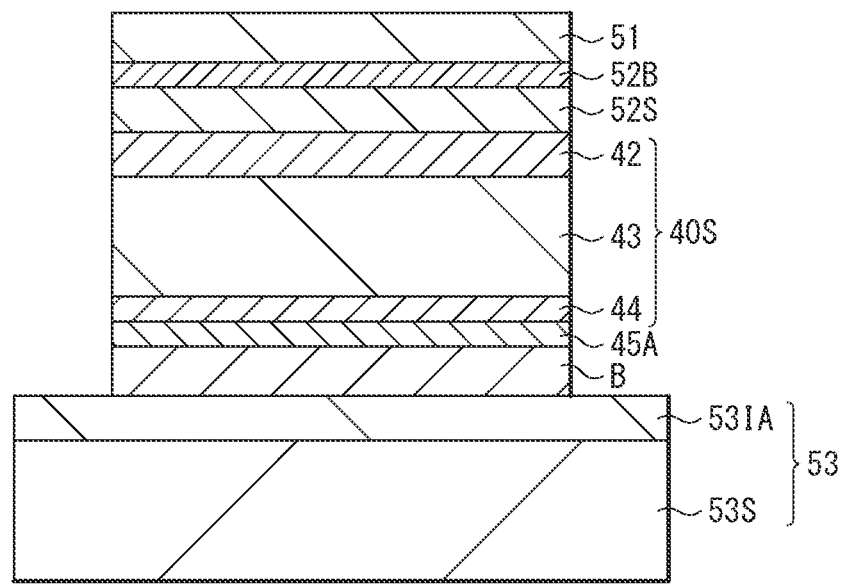

[ FIG. 8C ]
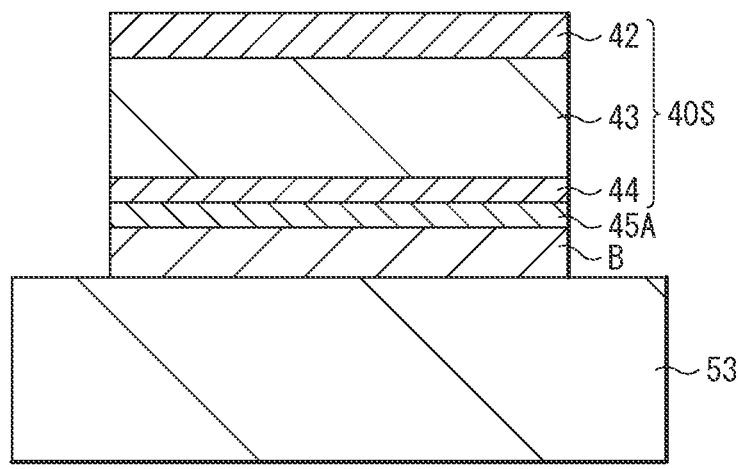
[ FIG. 8D ]
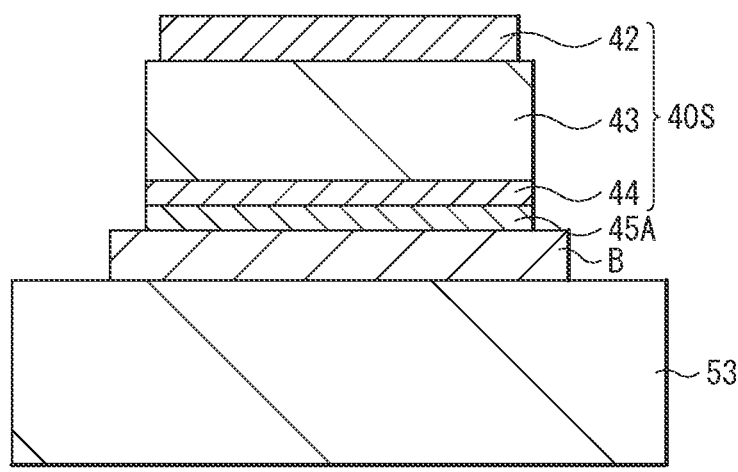

[FIG. 8E]
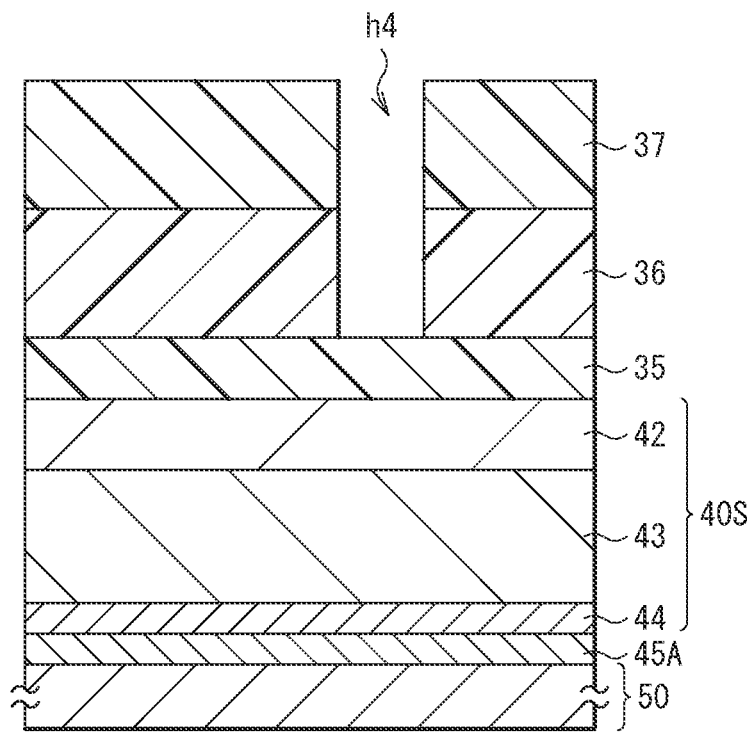
[FIG. 8F]
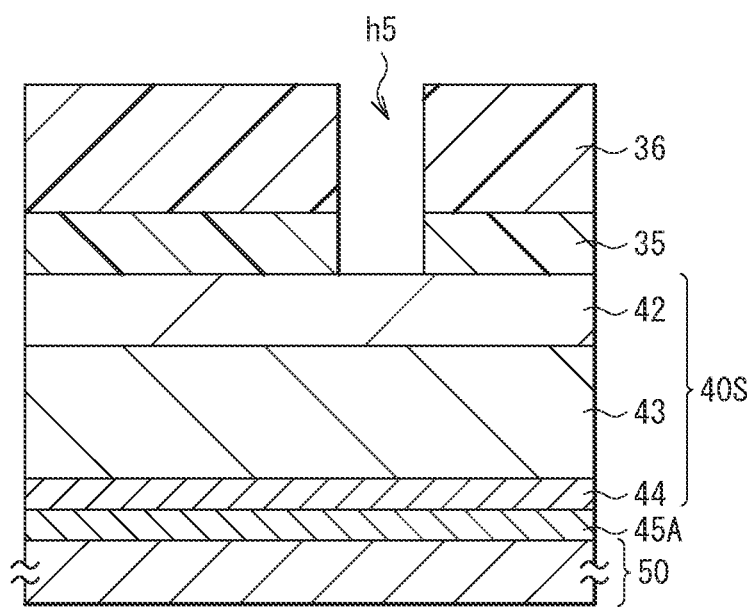

[ FIG. 8G ]
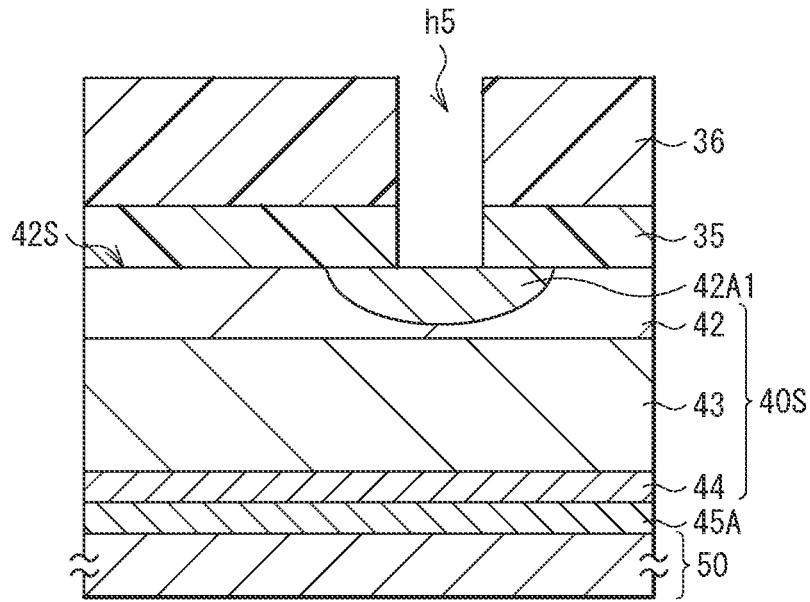
[ FIG. 8H ]
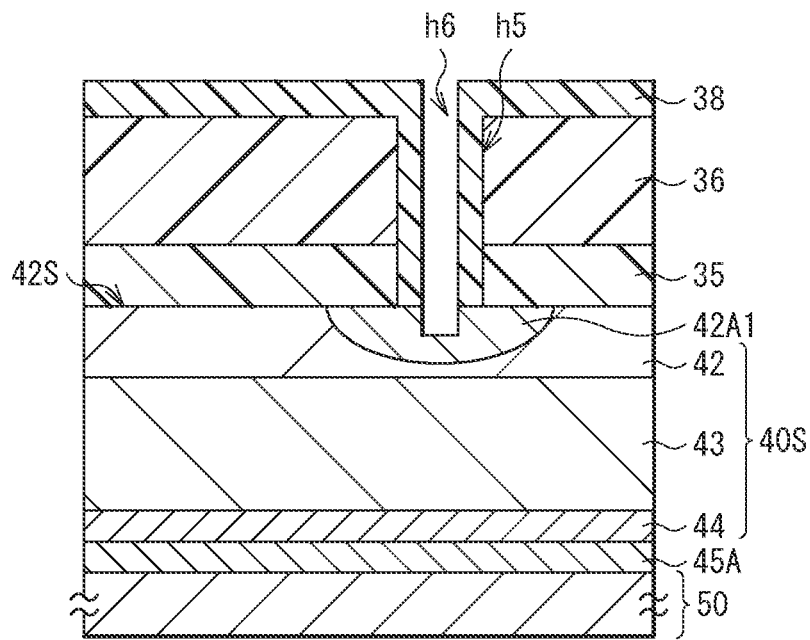

[ FIG. 8I ]
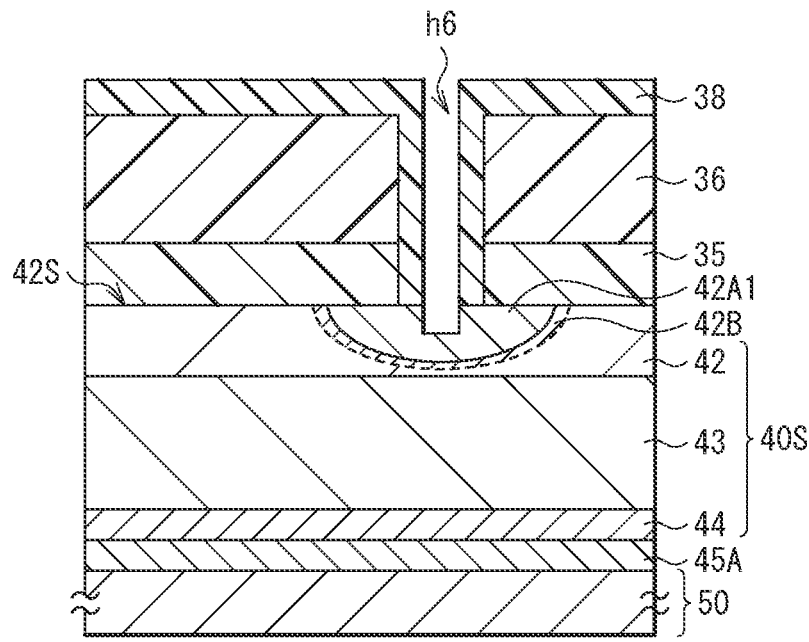
[ FIG. 8J ]
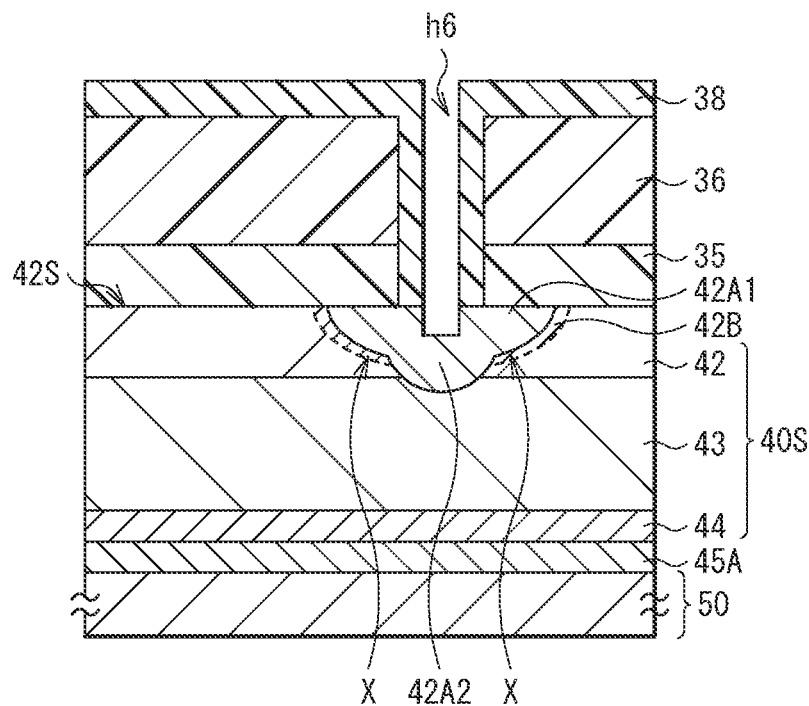

[ FIG. 8K ]
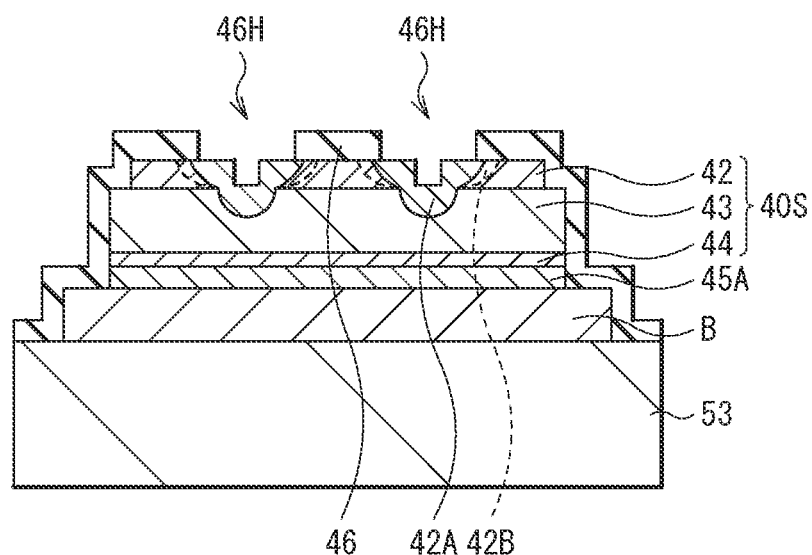
[ FIG. 9 ]
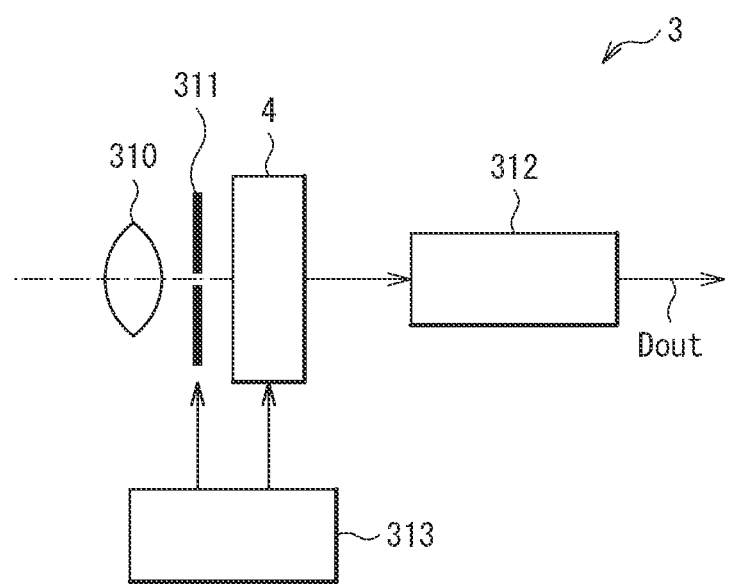

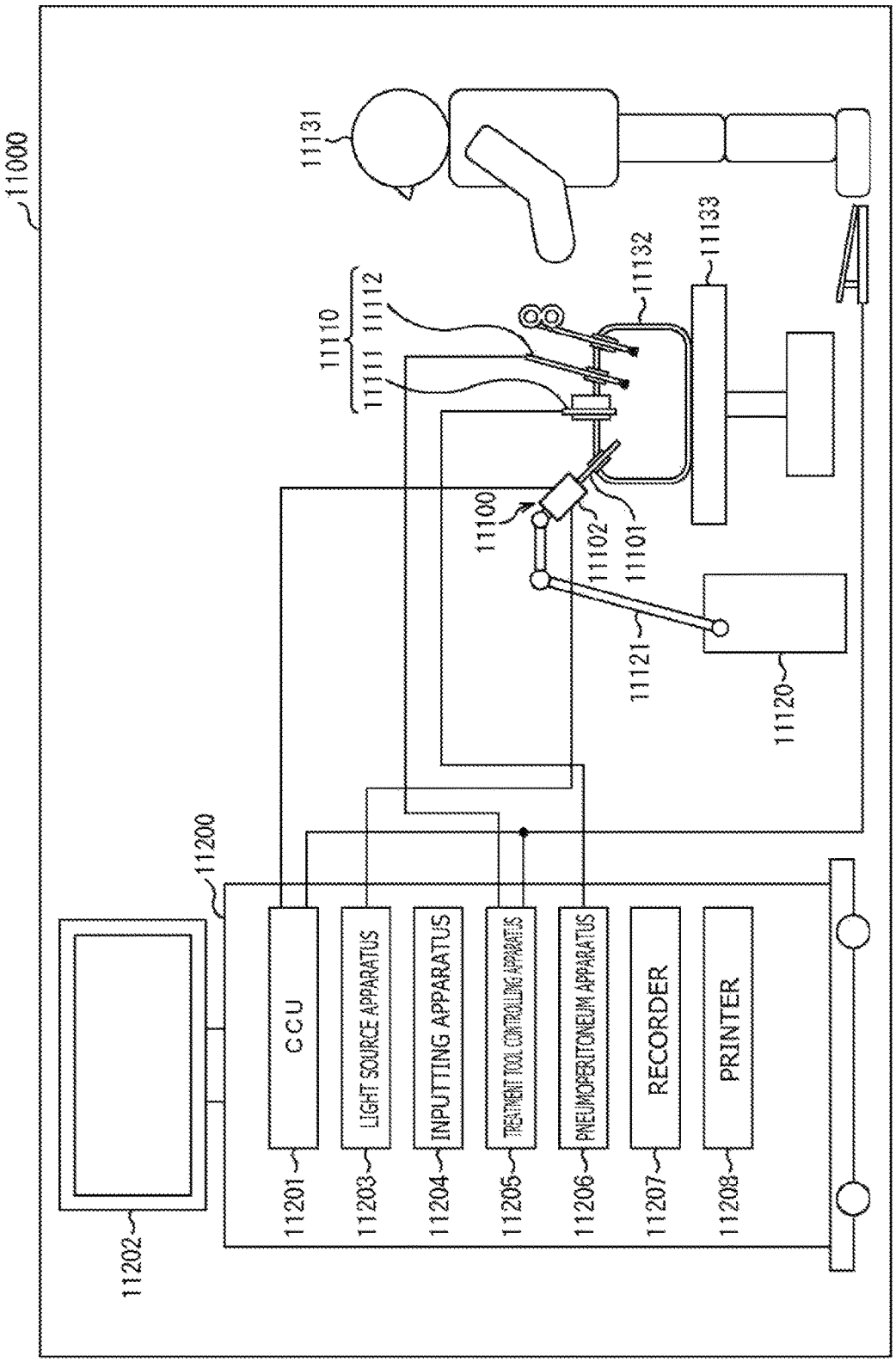

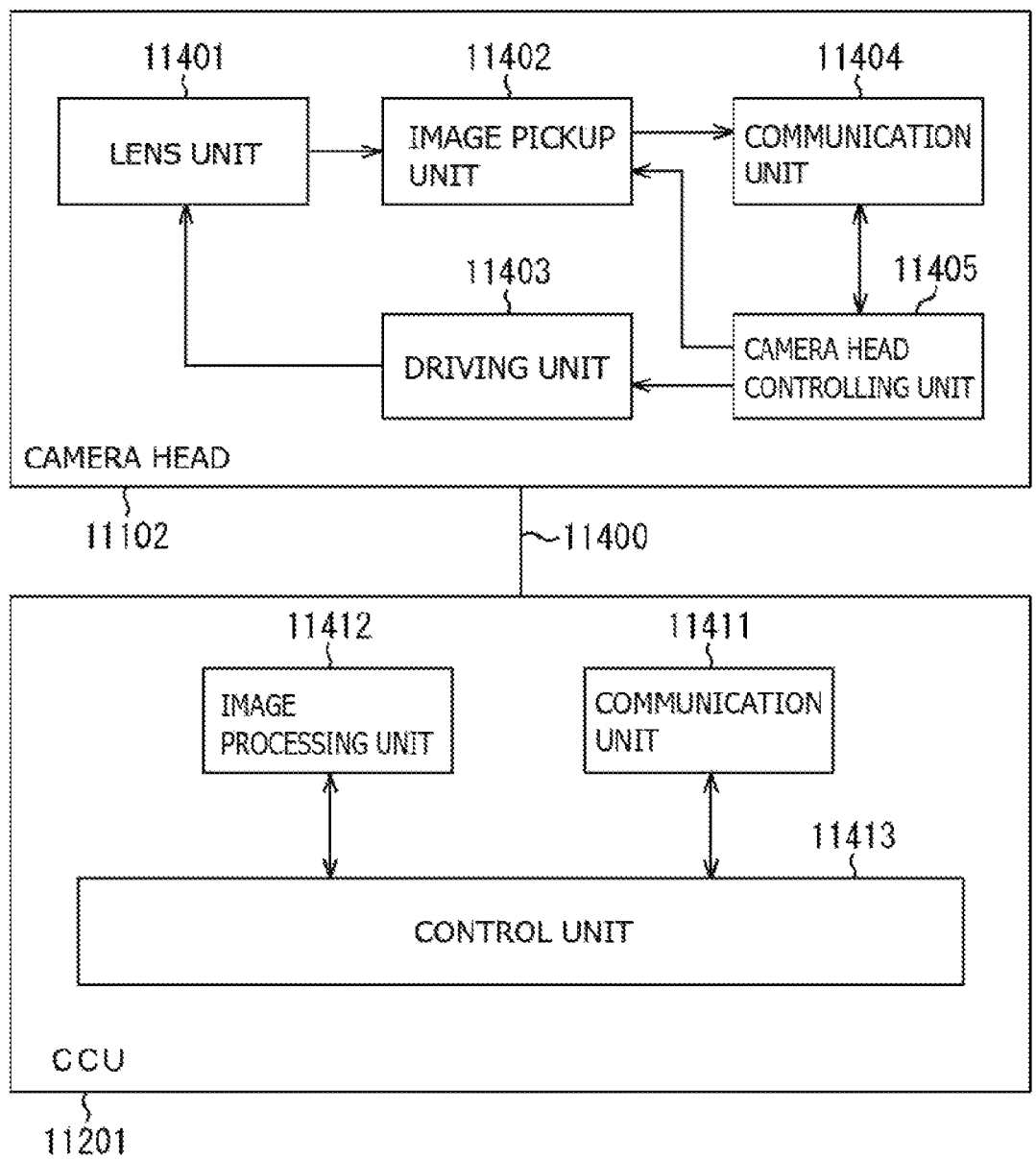
[FIG. 11]

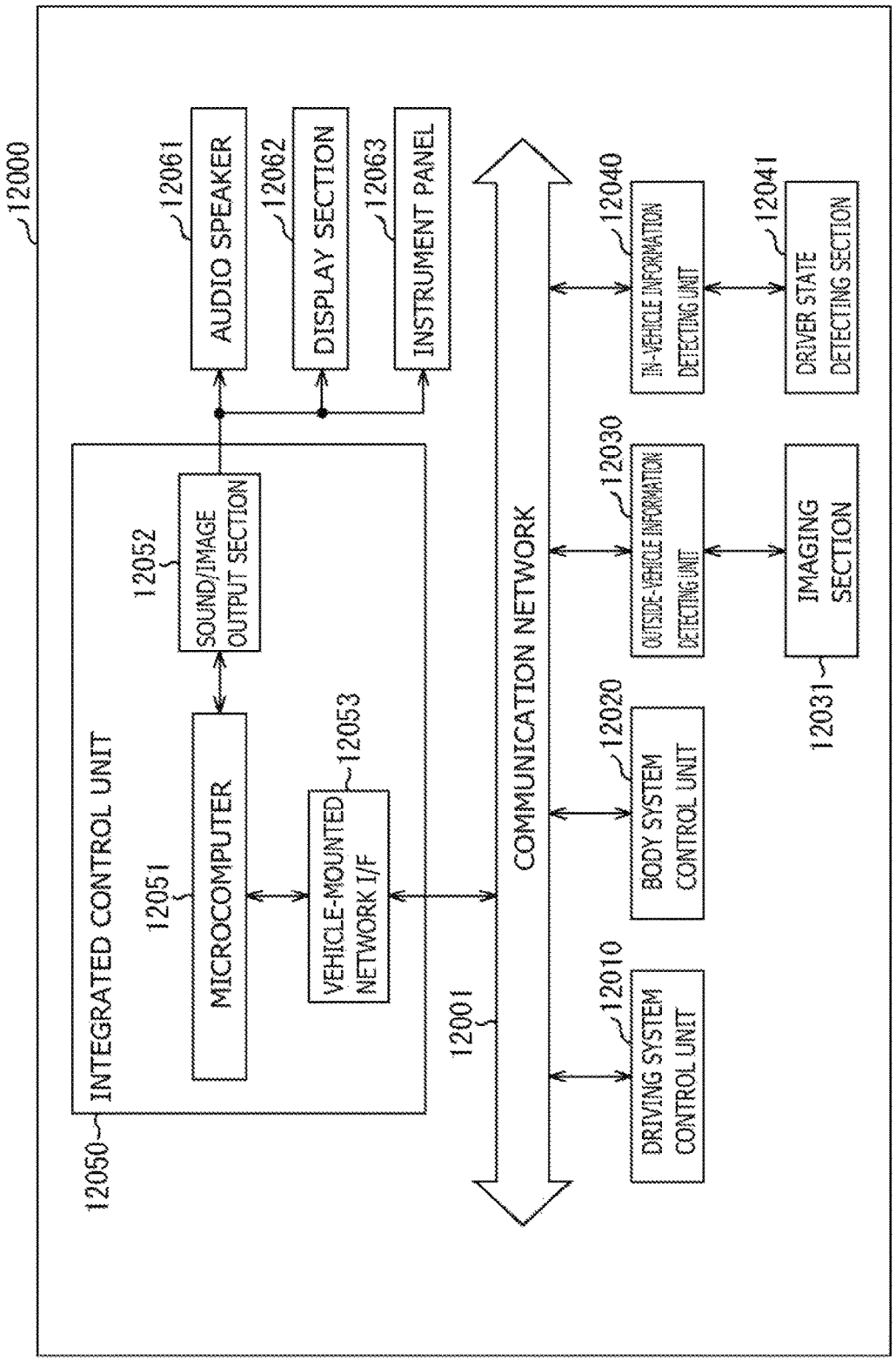

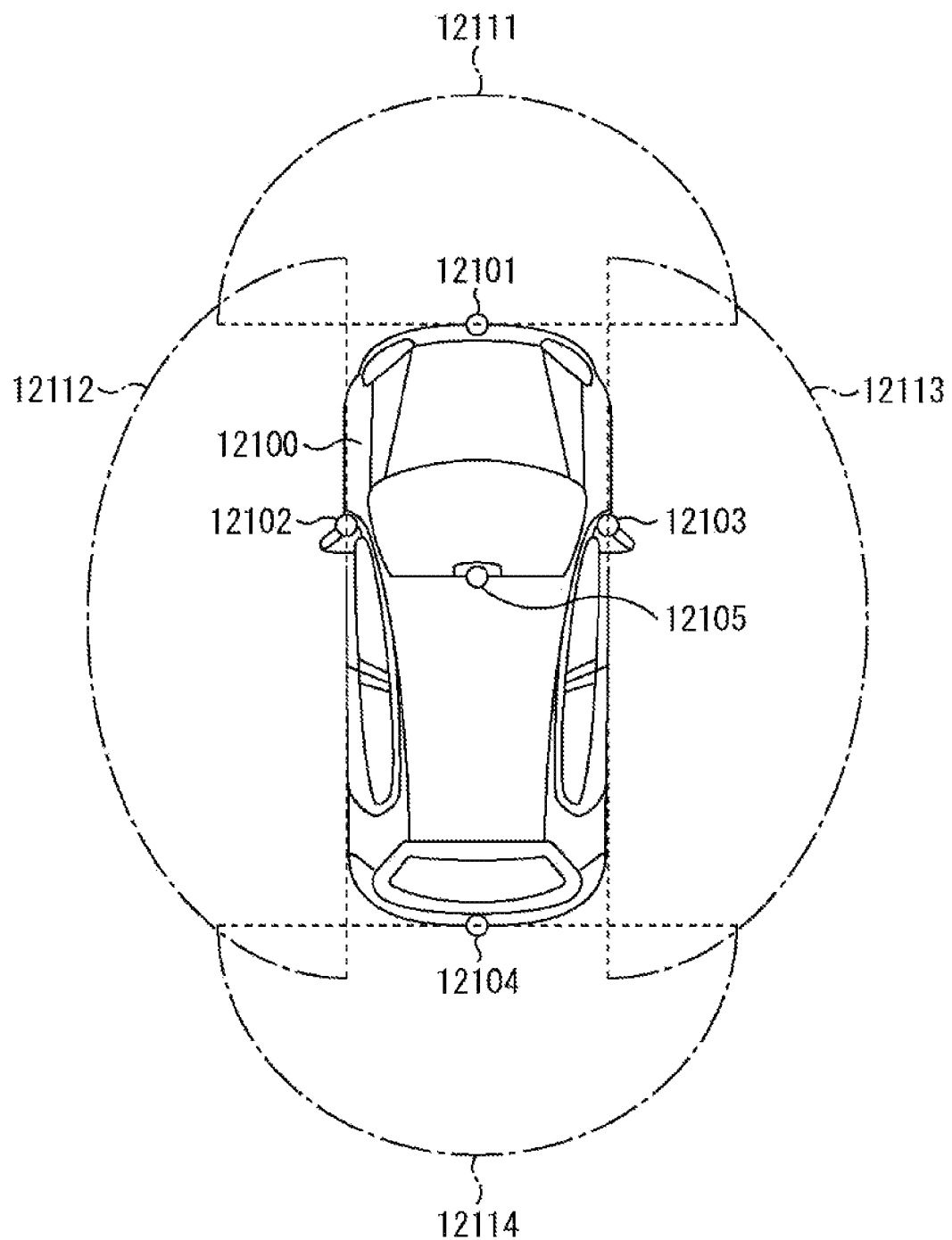
[FIG. 13]

LIGHT RECEIVING ELEMENT, METHOD OF MANUFACTURING LIGHT RECEIVING ELEMENT, AND IMAGING APPARATUS

TECHNICAL FIELD

The present disclosure relates to a light receiving element used, for example, for an infrared sensor or the like, a method of manufacturing the light receiving element, and to an imaging apparatus including the light receiving element.

BACKGROUND ART

For example, as described in PTL 1, a semiconductor device typified by an avalanche photodiode (APD), a PN photodiode, or the like has a uniform zinc concentration distribution in the depth direction and the lateral direction. The semiconductor device reads out a carrier from a zinc (Zn) diffusion electrode.

CITATION LIST

Patent Literature

PTL 1: Japanese Unexamined Patent Application Publication No. 2009-206499

SUMMARY OF THE INVENTION

Incidentally, the semiconductor device as described above is requested to reduce a dark current.

It is desirable to provide a light receiving element that makes it possible to reduce a dark current, a method of manufacturing the light receiving element, and an imaging apparatus.

A light receiving element according to an embodiment of the present disclosure includes: a semiconductor layer including a compound semiconductor material; a first impurity diffusion region provided on one surface of the semiconductor layer; and a second impurity diffusion region provided around the first impurity diffusion region. The second impurity diffusion region has a lower impurity concentration than an impurity concentration of the first impurity diffusion region.

An imaging apparatus according to an embodiment of the present disclosure has an element region in which a plurality of light receiving elements is disposed in an array. The imaging apparatus includes the light receiving element according to the embodiment described above as a light receiving element.

A method of manufacturing a light receiving element according to an embodiment of the present disclosure includes: forming a semiconductor layer including a compound semiconductor material; forming a mask layer having an opening on one surface of the semiconductor layer; forming a first impurity diffusion region on the one surface of the semiconductor layer by diffusing an impurity through the opening; and forming a second impurity diffusion region around the first impurity diffusion region through annealing treatment. The second impurity diffusion region has a lower impurity concentration than an impurity concentration of the first impurity diffusion region.

In the light receiving element, the method of manufacturing the light receiving element, and the imaging apparatus according to the respective embodiments of the present disclosure, the impurity diffusion region is provided on the one surface of the semiconductor layer. This relaxes the electric field in the first impurity diffusion region in the lateral direction. The semiconductor layer includes the compound semiconductor material. The impurity diffusion region gradually changes in impurity concentration.

BRIEF DESCRIPTION OF DRAWING

FIG. 1 is a cross-sectional schematic diagram illustrating an example of a configuration of a light receiving element according to a first embodiment of the present disclosure.

FIG. 2 is a plane schematic diagram illustrating a schematic configuration of the light receiving element illustrated in FIG. 1.

FIG. 3A is a cross-sectional schematic diagram for describing a step of a method of manufacturing the light receiving element illustrated in FIG. 1.

FIG. 3B is a cross-sectional schematic diagram illustrating a step subsequent to FIG. 3A.

FIG. 3C is a cross-sectional schematic diagram illustrating a step subsequent to FIG. 3B.

FIG. 3D is a cross-sectional schematic diagram illustrating a step subsequent to FIG. 3C.

FIG. 3E is a cross-sectional schematic diagram illustrating a step subsequent to FIG. 3D.

FIG. 3F is a cross-sectional schematic diagram illustrating a step subsequent to FIG. 3E.

FIG. 3G is a cross-sectional schematic diagram illustrating a step subsequent to FIG. 3F.

FIG. 3H is a cross-sectional schematic diagram illustrating a step subsequent to FIG. 3G.

FIG. 3I is a cross-sectional schematic diagram illustrating a step subsequent to FIG. 3H.

FIG. 3J is a cross-sectional schematic diagram illustrating a step subsequent to FIG. 3I.

FIG. 3K is a cross-sectional schematic diagram illustrating a step subsequent to FIG. 3J.

FIG. 3L is a cross-sectional schematic diagram illustrating a step subsequent to FIG. 3K.

FIG. 3M is a cross-sectional schematic diagram illustrating a step subsequent to FIG. 3L.

FIG. 3N is a cross-sectional schematic diagram illustrating a step subsequent to FIG. 3M.

FIG. 3O is a cross-sectional schematic diagram illustrating a step subsequent to FIG. 3N.

FIG. 3P is a cross-sectional schematic diagram illustrating a step subsequent to FIG. 3O.

FIG. 3Q is a cross-sectional schematic diagram illustrating a step subsequent to FIG. 3P.

FIG. 3R is a cross-sectional schematic diagram illustrating a step subsequent to FIG. 3Q.

FIG. 3S is a cross-sectional schematic diagram illustrating a step subsequent to FIG. 3R.

FIG. 4 is a cross-sectional schematic diagram illustrating an example of a configuration of a light receiving element according to a second embodiment of the present disclosure.

FIG. 5 is a plane schematic diagram illustrating a schematic configuration of the light receiving element illustrated in FIG. 4.

FIG. 6 is a diagram describing a field strength change in a diffusion region of a general light receiving element and a region around the diffusion region.

FIG. 7 is a diagram describing a field strength change in a diffusion region of the light receiving element illustrated in FIG. 4 and a region around the diffusion region.

FIG. 8A is a cross-sectional schematic diagram for describing a step of a method of manufacturing the light receiving element illustrated in FIG. 4.

FIG. 8B is a cross-sectional schematic diagram illustrating a step subsequent to FIG. 8A.

FIG. 8C is a cross-sectional schematic diagram illustrating a step subsequent to FIG. 8B.

FIG. 8D is a cross-sectional schematic diagram illustrating a step subsequent to FIG. 8C.

FIG. 8E is a cross-sectional schematic diagram illustrating a step subsequent to FIG. 8D.

FIG. 8F is a cross-sectional schematic diagram illustrating a step subsequent to FIG. 8E.

FIG. 8G is a cross-sectional schematic diagram illustrating a step subsequent to FIG. 8F.

FIG. 8H is a cross-sectional schematic diagram illustrating a step subsequent to FIG. 8G.

FIG. 8I is a cross-sectional schematic diagram illustrating a step subsequent to FIG. 8H.

FIG. 8J is a cross-sectional schematic diagram illustrating a step subsequent to FIG. 8I.

FIG. 8K is a cross-sectional schematic diagram illustrating a step subsequent to FIG. 8J.

FIG. 9 is a functional block diagram illustrating an example of an electronic apparatus (camera) including the light receiving element according to the present disclosure.

FIG. 10 is a view depicting an example of a schematic configuration of an endoscopic surgery system.

FIG. 11 is a block diagram depicting an example of a functional configuration of a camera head and a camera control unit (CCU).

FIG. 12 is a block diagram depicting an example of schematic configuration of a vehicle control system.

FIG. 13 is a diagram of assistance in explaining an example of installation positions of an outside-vehicle information detecting section and an imaging section.

MODES FOR CARRYING OUT THE INVENTION

The following describes an embodiment of the present disclosure in detail with reference to the drawings. The following description is a specific example of the present disclosure, but the present disclosure is not limited to the following modes. In addition, the present disclosure is not also limited to the disposition, dimensions, dimension ratios, and the like of the respective components illustrated in the respective diagrams. It is to be noted that description is given in the following order.
1. First Embodiment (Example of Light Receiving Element Having Zinc Diffusion Region that Gradually Changes)
1-1. Configuration of Light Receiving Element
1-2. Method of Manufacturing Light Receiving Element
1-3. Operation of Light Receiving Element
1-4. Workings and Effects
2. Second Embodiment (Example of Application to Light Receiving Element (PN Photodiode) Included in Imaging Apparatus)
2-1. Configuration of Light Receiving Element
2-2. Method of Manufacturing Light Receiving Element
2-3. Operation of Light Receiving Element
2-4. Workings and Effects
3. Application Examples
4. Practical Application Examples

1. First Embodiment

FIG. 1 schematically illustrates a cross-sectional configuration of a light receiving element (light receiving element 1) according to a first embodiment of the present disclosure. FIG. 2 schematically illustrates a planar configuration of the light receiving element 1 illustrated in FIG. 1. It is to be noted that FIG. 1 illustrates a cross-sectional configuration taken along an I-I' line illustrated in FIG. 2. This light receiving element 1 is a so-called avalanche photodiode (APD) including, for example, a compound semiconductor material such as a III-V group semiconductor. The light receiving element 1 is applied to an infrared sensor or the like. This light receiving element 1 is provided with a plurality of light receiving unit regions P (pixels P) that is two-dimensionally disposed, for example.

1-1. Configuration of Light Receiving Element

The light receiving element 1 has a photoelectric conversion function, for example, for light having a wavelength in the visible region (e.g., 380 nm or more and less than 780 nm) to the short infrared region (e.g., 780 nm or more and less than 2400 nm). For example, the light receiving element 1 has an element region R1 at the middle portion and a peripheral region R2 provided outside the element region R1 and surrounding the element region R1 (FIG. 2). The light receiving element 1 has a stacked structure in which an element substrate 10 and a readout circuit substrate 20 are stacked. The element substrate 10 has a light incidence surface (light incidence surface S1) and a bonding surface (bonding surface S2) that is opposed to the light incidence surface S1 and is bonded to the readout circuit substrate 20. The element substrate 10 includes a wiring layer 10W, a first electrode 11, a non-dope layer 12, a carrier transfer layer 13A, a photoelectric conversion layer 14, a carrier transfer layer 13B, and a second electrode 15 in this order from positions closer to the readout circuit substrate 20. The non-dope layer 12, the carrier transfer layers 13A and 13B, and the photoelectric conversion layer 14 are included in a semiconductor layer 10S common, for example, to the plurality of pixels P. There is provided a diffusion region 12X on a surface 12S2 of the non-dope layer 12 for each of the pixels P. Impurities are diffused in the diffusion region 12X. In the light receiving element 1 according to the present embodiment, the diffusion region 12X has a first diffusion region 12A and a second diffusion region 12B having a lower impurity concentration than that of the first diffusion region 12A. The diffusion region 12X has a configuration in which the second diffusion region 12B is provided around the first diffusion region 12A. This first diffusion region 12A corresponds to a specific example of a "first impurity diffusion region" according the present disclosure and the second diffusion region 12B corresponds to a specific example of a "second impurity diffusion region" according to the present disclosure.

In the light receiving element 1, light enters the photoelectric conversion layer 14 from the light incidence surface S1 of the element substrate 10 through a passivation film 16, the second electrode 15, and the carrier transfer layer 13B. The signal charge photoelectrically converted in the photoelectric conversion layer 14 moves through the first electrode 11 and the wiring layer 10W and is read out by the readout circuit substrate 20. The following describes a configuration of each section.

The first electrode 11 is an electrode (anode) to be supplied with a voltage for reading out the signal charges (holes or electrons, but description is given below on the assumption that the signal charge is holes for the sake of convenience) generated in the photoelectric conversion layer 14. The first electrode 11 is provided for each of the pixels P in the element region R1. The first electrode 11 is larger than an opening of an insulating film 17 and a portion of the first electrode 11 is provided in an embedded layer 18. In addition, a portion of the first electrode 11 protrudes to the non-dope layer 12 side. In other words, the upper surface (surface on the semiconductor layer 10S side) of the first electrode 11 is in contact with the diffusion region 12X and a portion thereof is formed in the non-dope layer 12. The lower surface and the side surfaces of the first electrode 11 are in contact with the embedded layer 18.

The adjacent first electrodes 11 are electrically separated from each other by the insulating film 17 and the embedded layer 18.

The first electrode 11 includes, for example, any of titanium (Ti), tungsten (W), titanium nitride (TiN), platinum (Pt), gold (Au), germanium (Ge), palladium (Pd), zinc (Zn), nickel (Ni), and aluminum (Al) alone or alloy including at least one of them. The first electrode 11 may be a single film including such a material or may be a stacked film obtained by combining two or more of them. For example, the first electrode 11 includes the stacked film (Ti/W) of titanium and tungsten. The thickness of the first electrode 11 is, for example, several tens of nm to several hundreds of nm.

The semiconductor layer 10S has a multi quantum well structure. For example, semiconductor layer 10S includes the non-dope layer 12, the carrier transfer layer 13A, the photoelectric conversion layer 14, and the carrier transfer layer 13B from the first electrode 11 side. The non-dope layer 12, the carrier transfer layers 13A and 13B, and the photoelectric conversion layer 14 each have the same planar shape. The respective end surfaces are disposed at the same position in a plan view.

The non-dope layer 12 is provided, for example, to all of the pixels P in common and is disposed between the insulating film 17 and the carrier transfer layer 13A. As described above, the non-dope layer 12 is provided with the plurality of diffusion regions 12X. The plurality of diffusion regions 12X is spaced apart from each other. Specifically, the diffusion regions 12X are disposed for the respective pixels P and the first electrode 11 is coupled to each of the diffusion regions 12X. The diffusion region 12X includes, for example, a p-type impurity. Examples of the p-type impurity include zinc (Zn), magnesium (Mg), and the like. In the non-dope layer 12, a high electric field region is formed by the diffusion region 12X. The signal charge generated in the photoelectric conversion layer 14 is transferred through the carrier transfer layer 13A. The signal strength is increased by the avalanche effect in this high electric field region.

In the present embodiment, the diffusion region 12X has a configuration in which the impurity concentration gradually changes. Specifically, the diffusion region 12X includes, for example, the first diffusion region 12A and the second diffusion region 12B having a lower impurity concentration than that of the first diffusion region 12A. The second diffusion region 12B is provided around the first diffusion region 12A. The first diffusion region 12A has, for example, an impurity concentration of 2E18 cm$^{-3}$ or more and 8E18 cm$^{-3}$ or less. The second diffusion region 12B has, for example, an impurity concentration of 1E17 cm$^{-3}$ or more and 2E18 cm$^{-3}$ or less.

In addition, the first diffusion region 12A has a diffusion shape with an inflection point X. For example, it is preferable that the first diffusion region 12A include a convex section C in the stacking direction (e.g., Z axis direction) of the respective layers 12, 13, and 14 included in the semiconductor layer 10S. This convex section C penetrates the second diffusion region 12B. In other words, the diffusion region 12X forms a gradual impurity concentration gradient in the horizontal direction (XY plane direction) and a steep impurity concentration gradient in the longitudinal direction (Z axis direction). This concentrates the electric field on the convex section C and relaxes the electric field in the diffusion region 12X in the in the lateral direction. The generation of a dark current is suppressed that causes noise.

Further, it is preferable that the diffusion region 12X be formed in the non-dope layer 12. In other words, it is desirable that the tip of the convex section C in the first diffusion region 12A be in the non-dope layer 12. This makes it possible to concentrate the electric field in the gap between the convex section C and the non-dope layer 12. The avalanche effect increases and the sensitivity increases.

There is provided a groove tin the first diffusion region 12A of the diffusion region 12X. This groove t is described below in detail. The groove t is provided in a case where the diffusion region 12X is formed. The first electrode 11 is embedded therein.

The carrier transfer layer 13A is provided, for example, to all of the pixels P in common. This carrier transfer layer 13A is provided between the non-dope layer 12 and the photoelectric conversion layer 14. The carrier transfer layer 13A is in contact with them. The carrier transfer layer 13A is for transferring the electric charges (e.g., holes) generated in the photoelectric conversion layer 14 to the high electric field region in the non-dope layer 12. The carrier transfer layer 13A includes, for example, a compound semiconductor including an n-type impurity. For example, it is possible to use n-type InP (indium phosphide) for the carrier transfer layer 13A.

The photoelectric conversion layer 14 is provided, for example, to all of the pixels P in common. This photoelectric conversion layer 14 is provided between the carrier transfer layer 13A and the carrier transfer layer 13B. The photoelectric conversion layer 14 is in contact with them. The photoelectric conversion layer 14 absorbs light having a predetermined wavelength to generate signal charges. The photoelectric conversion layer 14 includes, for example, a compound semiconductor material such as an i-type III-V group semiconductor. Examples of the compound semiconductor material included in the photoelectric conversion layer 14 include i-type InGaAs (indium gallium arsenide) and the like. The photoelectric conversion layer 14 photoelectrically converts, for example, light having a wavelength in the visible region to the short infrared region.

The carrier transfer layer 13B is provided, for example, to all of the pixels P in common. This carrier transfer layer 13B is provided between the photoelectric conversion layer 14 and the second electrode 15. The carrier transfer layer 13B is in contact with them. The carrier transfer layer 13B is for transferring the electric charges (e.g., electrons) generated in the photoelectric conversion layer 14 to the second electrode 15. The carrier transfer layer 13B includes, for example, a compound semiconductor including an n-type impurity. For example, it is possible to use n-type InP (indium phosphide) for the carrier transfer layer 13B.

The second electrode 15 is provided, for example, as an electrode common to each of the pixels P, on the carrier transfer layer 13B (light incidence side) in contact with the carrier transfer layer 13B. The second electrode 15 is for discharging electric charges that are not used as signal charges among the electric charges generated in the photoelectric conversion layer 14 (cathode). For example, in a case where holes are read out from the first electrode 11 as signal charges, it is possible to discharge, for example, electrons through this second electrode 15. The second electrode 15 includes, for example, an electrically conducive film that is able to transmit incident light such as an infrared ray. It is possible to use, for example, ITO (Indium Tin Oxide), ITiO ($In_2O_3$—$TiO_2$), or the like for the second electrode 15. The second electrodes 15 may be provided, for example, in a lattice shape to partition the adjacent pixels P. In that case, it is possible to use an electrically conductive material having low light transmissivity.

The passivation film 16 covers the second electrode 15 from the light incidence surface S1 side. The passivation film 16 may have an antireflection function. It is possible to use, for example, silicon nitride (SiN), aluminum oxide ($Al_2O_3$), silicon oxide (Sift), tantalum oxide ($Ta_2O_3$), and the like for the passivation film 16.

The element substrate 10 includes an electrically conducive film 15B provided from the element region R1 to the peripheral region R2. This electrically conducive film 15B is included in an OPB (Optical Black) region R1B. The electrically conducive film 15B has an opening in the region opposed to the middle portion of the element region R1. In other words, the OPB region R1B is provided to surround the light receiving region. The OPB region R1B is used to obtain a black-level pixel signal. The passivation film 16 has an opening 16H in the OPB region R1B. The opening 16H is provided, for example, in a frame shape surrounding the light receiving region (FIG. 2). The opening 16H may be, for example, a hole having a quadrangular shape or a circular shape in a plan view. This opening 16H of the passivation film 16 electrically couples the electrically conductive film 15B to the second electrode 15. The element substrate 10 further includes the insulating film 17 and the embedded layer 18. The insulating film 17 is provided to cover the opposed surface to the wiring layer 10W of the semiconductor layer 10S and an end surface (side surface). The embedded layer 18 is provided over the whole of the element region R1 and the peripheral region R2. The embedded layer 18 forms the bonding surface S2. The bonding surface S2 in the element region R1 and the bonding surface S2 in the peripheral region R2 are flush with each other.

The electrically conductive film 15B is provided from the OPB region R1B to an opening H1 in the peripheral region R2 described below. This electrically conductive film 15B is in contact with the second electrode 15 at the opening 16H of the passivation film 16 provided in the OPB region R1B as described above. The electrically conductive film 15B is also in contact with a wiring line (wiring line 22CB described below) of the readout circuit substrate 20 through the opening H1. This supplies a voltage from the readout circuit substrate 20 to the second electrode 15 through the electrically conductive film 15B. The electrically conductive film 15B functions as such a voltage supply path to the second electrode 15 and also has a function as a light shielding film to form the OPB region R1B. The electrically conductive film 15B includes, for example, a metal material including tungsten (W), aluminum (Al), titanium (Ti), molybdenum (Mo), tantalum (Ta), or copper (Cu). There may be provided a passivation film on the electrically conductive film 15B.

There may be provided an adhesive layer B between an end of the carrier transfer layer 13B and the second electrode 15. This adhesive layer B is used to form the light receiving element 1 as described below. The adhesive layer B serves to bond the semiconductor layer 10S to a temporary substrate (temporary substrate 33 in FIG. 3C described below). The adhesive layer B includes, for example, silicon oxide ($SiO_2$) and the like. The adhesive layer B is provided, for example, to be wider than an end surface of the semiconductor layer 10S. The adhesive layer B is covered with the embedded layer 18 along with the semiconductor layer 10S. The insulating film 17 is provided between the adhesive layer B and the embedded layer 18. It is to be noted that the adhesive layer B may be provided over a broad region of the peripheral region R2. For example, the adhesive layer B may extend from the region near an edge of the semiconductor layer 10S (element region R1) to the space between the opening H1 and an opening H2. Alternatively, the adhesive layer B may extend from the region near the edge of the semiconductor layer 10S (element region R1) to a chip end (chip end E).

The insulating film 17 is provided between the non-dope layer 12 and the embedded layer 18. The insulating film 17 covers end surfaces of the non-dope layer 12, the carrier transfer layer 13A, the photoelectric conversion layer 14, and the carrier transfer layer 13B and an end surface of the second electrode 15. The insulating film 17 is in contact with the passivation film 16 in the peripheral region R2. The insulating film 17 includes, for example, an oxide such as silicon oxide ($SiO_2$) or aluminum oxide ($Al_2O_3$). The insulating film 17 may have a stacked structure including a plurality of films. The insulating film 17 may include, for example, a silicon (Si)-based insulating material such as silicon oxynitride (SiON), carbon-containing silicon oxide (SiOC), silicon nitride (SiN), and silicon carbide (SiC). The thickness of the insulating film 17 is, for example, several tens of nm to several hundreds of nm.

The embedded layer 18 is for filling a level difference between the temporary substrate (temporary substrate 33 in FIG. 3B described below) and the semiconductor layer 10S in a step of manufacturing the light receiving element 1. In the light receiving element 1, the formation of this embedded layer 18 suppresses the occurrence of a defect in the manufacturing step caused by the level difference between the semiconductor layer 10S and the temporary substrate 33.

The embedded layer 18 in the element region R1 is provided between the semiconductor layer 10S and the wiring layer 10W to cover the first electrode 11. The embedded layer 18 in the peripheral region R2 is provided between the wiring layer 10W and the insulating film 17 and between the wiring layer 10W and the passivation film 16. For example, the embedded layer 18 has a thickness larger than or equal to the thickness of the semiconductor layer 10S. Here, this embedded layer 18 is provided to surround the semiconductor layer 10S and the region (peripheral region R2) around the semiconductor layer 10S is thus formed. This makes it possible to provide the bonding surface S2 to the readout circuit substrate 20 in this peripheral region R2.

The surface of the embedded layer 18 on the bonding surface S2 side is planarized. The wiring layer 10W is provided on this planarized surface of the embedded layer 18 in the peripheral region R2. It is possible to use, for example, an inorganic insulating material such as silicon oxide (SiOx), silicon nitride (SiN), silicon oxynitride (SiON), carbon-containing silicon oxide (SiOC), and silicon carbide (SiC) for the embedded layer 18.

The embedded layer 18 in the peripheral region R2 is provided with the openings H1 and H2 that penetrate the embedded layer 18. These openings H1 and H2 penetrate the wiring layer 10W in addition to the embedded layer 18 to reach the readout circuit substrate 20. Each of the openings H1 and H2 has, for example, a quadrangular planar shape. The plurality of respective openings H1 and H2 is provided to surround the element region R1 (FIG. 2). The opening H1 is provided at a position closer to the element region R1 than the opening H2. The side wall and the bottom surface of the opening H1 are covered with the electrically conductive film 15B described below. The opening H1 is for coupling the second electrode 15 (electrically conductive film 15B) and a wiring line (wiring line 22CB described below) of the readout circuit substrate 20. The opening H1 is provided by penetrating the passivation film 16, the embedded layer 18, and the wiring layer 10W.

The opening H2 is provided, for example, at a position closer to the chip end E than the opening H1. This opening H2 reaches the pad electrode (pad electrode 22P described below) of the readout circuit substrate 20 through the passivation film 16, the embedded layer 18, and the wiring layer 10W. The light receiving element 1 is electrically coupled to the outside through this opening H2. The openings H1 and H2 do not also have to reach the readout circuit substrate 20. For example, the openings H1 and H2 may reach a wiring line of the wiring layer 10W and this wiring line may be coupled to the wiring line 22CB and the pad electrode 22P of the readout circuit substrate 20. The openings H1 and H2 may extend through the adhesive layer B described below.

The wiring layer 10W is provided over the element region R1 and the peripheral region R2 and has the bonding surface S2 to the readout circuit substrate 20. In the light receiving element 1, this bonding surface S2 of the element substrate 10 is provided in the element region R1 and the peripheral region R2. For example, the bonding surface S2 in the element region R1 and the bonding surface S2 in the peripheral region R2 are flush with each other.

The wiring layer 10W includes, for example, a contact electrode 19E and a dummy electrode 19ED in interlayer insulating films 19A and 19B. For example, the interlayer insulating film 19B is disposed on the readout circuit substrate 20 side and the interlayer insulating film 19A is disposed on the non-dope layer 12 side. These interlayer insulating films 19A and 19B are provided to be stacked. Each of the interlayer insulating films 19A and 19B includes, for example, an inorganic insulating material. Examples of this inorganic insulating material include silicon nitride (SiN), aluminum oxide ($Al_2O_3$), silicon oxide ($SiO_2$), hafnium oxide ($HfO_2$), and the like. Each of the interlayer insulating films 19A and 19B may include the same inorganic insulating material.

The contact electrode 19E is provided, for example, in the element region R1. The contact electrode 19E is for electrically coupling the first electrode 11 and the readout circuit substrate 20 and is provided for each of the pixels P in the element region R1. The adjacent contact electrodes 19E are electrically separated from each other by the embedded layer 18 and the interlayer insulating films 19A and 19B. The contact electrode 19E includes, for example, a copper (Cu) pad and is exposed from the bonding surface S2. The dummy electrode 19ED is provided, for example, in the peripheral region R2. This dummy electrode 19ED is coupled to a dummy electrode 22ED of a wiring layer 20W described below. Providing these dummy electrode 19ED and dummy electrode 22ED makes it possible to increase the strength of the peripheral region R2. The dummy electrode 19ED is formed in the same step as that of the contact electrode 19E, for example. The dummy electrode 19ED includes, for example, a copper (Cu) pad and is exposed from the bonding surface S2.

Holes and electrons generated in the photoelectric conversion layer 14 are respectively read out from the first electrode 11 and the second electrode 15. To perform this readout operation at high speed, it is preferable that the distance between the first electrode 11 and the second electrode 15 be set at the distance which is enough for photoelectric conversion, but is not too long. In other words, it is preferable to decrease the thickness of the element substrate 10. For example, the distance between the first electrode 11 and the second electrode 15 or the thickness of the element substrate 10 is 10 μm or less. Further, the distance between the first electrode 11 and the second electrode 15 or the thickness of the element substrate 10 is 7 μm or less. Still further, the distance between the first electrode 11 and the second electrode 15 or the thickness of the element substrate 10 is 5 μm or less.

The readout circuit substrate 20 is so-called ROIC (Readout integrated circuit). The readout circuit substrate 20 includes the wiring layer 20W and a multilayer wiring layer 22C and a semiconductor substrate 21. The wiring layer 20W and the multilayer wiring layer 22C are in contact with the bonding surface S2 of the element substrate 10. The semiconductor substrate 21 is opposed to the element substrate 10 with these wiring layer 20W and multilayer wiring layer 22C interposed in between.

The semiconductor substrate 21 of the readout circuit substrate 20 is opposed to the element substrate 10 with the wiring layer 20W and the multilayer wiring layer 22C interposed in between. This semiconductor substrate 21 includes, for example, silicon (Si). There is provided a plurality of transistors near the surface (surface on the wiring layer 20W side) of the semiconductor substrate 21. For example, the plurality of these transistors is used to configure a readout circuit (Read Out Circuit) for each of the pixels P. The wiring layer 20W includes, for example, an interlayer insulating film 22A and an interlayer insulating film 22B in this order from the element substrate 10 side and these interlayer insulating films 22A and 22B are provided to be stacked. For example, a contact electrode 22E and the dummy electrode 22ED are provided in the interlayer insulating film 22A. The multilayer wiring layer 22C is provided to be opposed to the element substrate 10 with the wiring layer 20W interposed in between. For example, the pad electrode 22P and the plurality of wiring lines 22CB are provided in this multilayer wiring layer 22C. Each of the interlayer insulating films 22A and 22B includes, for example, an inorganic insulating material. Examples of this inorganic insulating material include silicon nitride (SiN), aluminum oxide ($Al_2O_3$), silicon oxide ($SiO_2$), hafnium oxide ($HfO_2$), and the like.

The contact electrode 22E is for electrically coupling the first electrode 11 and the wiring line 22CB and is provided for each of the pixels P in the element region R1. This contact electrode 22E is in contact with the contact electrode 19E at the bonding surface S2 of the element substrate 10. The adjacent contact electrodes 22E are electrically separated from each other by the interlayer insulating film 22A.

The dummy electrode 22ED provided in the peripheral region R2 is in contact with the dummy electrode 19ED at the bonding surface S2 of the element substrate 10. This dummy electrode 22ED is formed in the same step as that of the contact electrode 22E, for example. The contact electrode 22E and the dummy electrode 22ED each include, for example, a copper (Cu) pad and are each exposed from the surface of the readout circuit substrate 20 opposed to the element substrate 10. In other words, for example, CuCu bonding is established between the contact electrode 19E and the contact electrode 22E and between the dummy electrode 19ED and the dummy electrode 22ED. This allows the pixels P to be finer.

The wiring line 22CB coupled to the contact electrode 19E is coupled to a transistor provided near the surface of the semiconductor substrate 21. The first electrode 11 and the readout circuit are coupled for each of the pixels P. The wiring line 22CB coupled to the electrically conductive film 15B through the opening H1 is coupled, for example, to a predetermined potential. In this way, one (e.g., hole) of the electric charges generated in the photoelectric conversion layer 14 is read out by a readout circuit from the first electrode 11 through the contact electrodes 19E and 22E. The other (e.g., electron) of the electric charges generated in the photoelectric conversion layer 14 is discharged to a predetermined potential from the second electrode 15 through the electrically conductive film 15B.

The pad electrode 22P provided in the peripheral region R2 is for establishing electrical coupling to the outside. The light receiving element 1 is provided with the opening H2 near the chip end E. The opening H2 reaches the pad electrode 22P through the element substrate 10. Electrical coupling to the outside is established through this opening H2. The coupling is established, for example, in a method such as wire bonding or bump. For example, a predetermined potential may be supplied to the second electrode 15 from an external terminal disposed in the opening H2 through the wiring line 22CB of the readout circuit substrate 20 and the electrically conductive film 15B. As a result of the photoelectric conversion in the photoelectric conversion layer 14, a signal voltage read out from the first electrode 11 may be read out by the readout circuit of the semiconductor substrate 21 through the contact electrodes 19E and 22E. The signal voltage may be outputted to the external terminal disposed in the opening H2 via this readout circuit. The signal voltage may be outputted to the external terminal, for example, via other circuits included in the readout circuit substrate 20 in addition to the readout circuit. The other circuits include, for example, a signal processing circuit, an output circuit, and the like.

It is preferable that the thickness of the readout circuit substrate 20 be greater than the thickness of the element substrate 10. For example, it is preferable that the thickness of the readout circuit substrate 20 be two times or more greater than the thickness of the element substrate 10. It is more preferable that the thickness of the readout circuit substrate 20 be five times or more greater than the thickness of the element substrate 10. It is still more preferable that the thickness of the readout circuit substrate 20 be ten times or more greater than the thickness of the element substrate 10. Alternatively, the thickness of the readout circuit substrate 20 is, for example, 100 µm or more, 150 µm or more, or 200 µm or more. The readout circuit substrate 20 having such a large thickness secures the light receiving element 1 mechanical strength. It is to be noted that this readout circuit substrate 20 may include only the one layer of the semiconductor substrate 21 forming the circuit or may further include a substrate such as a support substrate in addition to the semiconductor substrate 21 forming the circuit.

1-2. Method of Manufacturing Light Receiving Element

It is possible to manufacture the light receiving element 1, for example, as follows. FIGS. 3A to 3S illustrate steps of manufacturing the light receiving element 1 in the order of steps.

First, as illustrated in FIG. 3A, for example, a buffer layer 32B including n-type InP, a stopper layer 32S including i-type InGaAs, the semiconductor layer 10S, and a cap layer 15A including i-type InGaAs are subjected to epitaxial growth in this order on a growth substrate 31 including, for example, InP. The thickness of the growth substrate 31 is, for example, several hundreds of µm and the thickness of the semiconductor layer 10S is, for example, several µm. After that, the adhesive layer B is formed on the semiconductor layer 10S. The bore of the growth substrate 31 is, for example, six inches or less. The semiconductor layer 10S is formed, for example, by subjecting i-type InP included in the non-dope layer 12, n-type InP included in the carrier transfer layer 13A, i-type InGaAs included in the photoelectric conversion layer 14, and n-type InP included in the carrier transfer layer 13B to epitaxial growth in this order.

Next, as illustrated in FIG. 3B, the growth substrate 31 on which the semiconductor layer 10S is formed is bonded to the temporary substrate 33 with the adhesive layer B interposed in between. The temporary substrate 33 includes, for example, an insulating layer (insulating layer 33IA) and a substrate 33S. The insulating layer 33IA is disposed, for example, between the adhesive layer B and the substrate 33S. A substrate having a bore larger than that of the growth substrate 31 is used for the temporary substrate 33. For example, a silicon (Si) substrate is used for the substrate 33S. The bore of the temporary substrate 33 is, for example, eight inches to twelve inches. Bonding the growth substrate 31 having a small bore to the temporary substrate 33 having a large bore allows a variety of devices for a substrate having a large bore to be used in a case where the element substrate 10 is formed. This allows CuCu bonding to be used, for example, as the bonding between the readout circuit substrate 20 and the element substrate 10 and allows the pixels P to be finer. The growth substrate 31 may be bonded to the temporary substrate 33 by plasma-activated bonding, normal temperature bonding, bonding with an adhesive (adhesive bonding), or the like. In this way, for example, the wafer-shaped semiconductor layer 10S is bonded to the temporary substrate 33. The thickness of the temporary substrate 33 is, for example, several hundreds of µm.

Subsequently, as illustrated in FIG. 3C, the growth substrate 31 including the buffer layer 32B and the stopper layer 32S is removed. It is possible to remove the growth substrate 31 by mechanical grinding, CMP (Chemical Mechanical Polishing: chemical mechanical polishing), wet etching, dry etching, or the like. A portion of the growth substrate 31 may be then left unremoved. In addition, a portion of the semiconductor layer 10S may be etched.

Next, as illustrated in FIG. 3D, for example, the semiconductor layer 10S is etched to a predetermined size in accordance with a mark of the temporary substrate 33. This forms the semiconductor layer 10S in the state of a plurality of chips.

Subsequently, as illustrated in FIGS. 3E to 3J, the diffusion region 12X is formed on the semiconductor layer 10S for each of the pixels P. It is to be noted that each of FIGS. 3E to 3J is an enlarged view of the one pixel P.

First, as illustrated in FIG. 3E, for example, a $SiO_2$ film 35 and a SiN film 36 are formed in this order as a hard mask on the semiconductor layer 10S. Next, a photoresist 37 is formed on the SiN film 36 and an opening h1 is formed that extends through the photoresist 37 and the SiN film 36. Subsequently, as illustrated in FIG. 3F, the photoresist 37 is removed by wet etching, dry etching, or the like and an opening h2 is formed that extends through the $SiO_2$ film 35. It is to be noted that the hard mask is not limited to the stacked film of the $SiO_2$ film/the SiN film described above. For example, the hard mask may be the single layer film of the $SiO_2$ film or the SiN film.

Next, as illustrated in FIG. 3G, p-type impurities (e.g., zinc (Zn)) are diffused to form a diffusion region 12A1.

Impurities are diffused by using, for example, diethylzinc (DEZ) gas or dimethylzinc (DMZ) gas as gas phase diffusion under a condition of 200° C. to 600° C. It is preferable that the diffusion depth be 10 to 100 nm shorter in distance than the film thickness of the carrier transfer layer 13B. Impurities are substantially isotropically diffused from a surface 12S of the non-dope layer 12 to form the substantially hemispherical diffusion region 12A1. Subsequently, as illustrated in FIG. 3H, a sidewall 38 is formed in the opening h2 and on the SiN film 36 and an opening h3 is then formed in the opening h2. The sidewall 38 includes, for example, silicon nitride (SiN), silicon oxide ($SiO_2$), aluminum oxide ($Al_2O_3$), tantalum oxide ($Ta_2O_5$), SiC, SiCO, or the like. The opening h3 extends into the diffusion region 12A1. This opening h3 corresponds to the groove t described above. After the opening h3 is formed, annealing treatment is performed. This diffuses p-type impurity around the diffusion region 12A1 as illustrated in FIG. 3I and forms the second diffusion region 12B that has a lower impurity concentration than that of the diffusion region 12A1 and has a substantially hemispherical shape as with the diffusion region 12A1. Next, p-type impurities are subjected again to gas phase diffusion through the opening h3 to form a diffusion region 12A2 corresponding to the convex section C in the first diffusion region 12A. It is preferable that the diffusion depth be, for example, 5 nm or more shorter in distance than that of the first Zn diffusion. The p-type impurities are substantially isotropically diffused. The ratio (first/second) between the distance of first diffusion and the distance of the second diffusion is, for example, less than 1. It is possible to adjust the target distance that is determined after the second diffusion in accordance with the digging depth of the opening h3. This forms the first diffusion region 12A having a diffusion shape with the inflection point X.

Subsequently, after the $SiO_2$ film 35 and the SiN film 36 are removed as illustrated in FIG. 3K, the insulating film 17 is formed around the semiconductor layer 10S by using, for example, tetraethoxysilane (TEOS). It is to be noted that the $SiO_2$ film 35 and the SiN film 36 do not necessarily have to be removed. These may be used as the insulating film 17. Next, as illustrated in FIG. 3L, the first electrode 11 is formed on the semiconductor layer 10S. Further, the embedded layer 18 is formed on the whole of the temporary substrate 33. For example, the first electrode 11 is formed by forming the stacked film of titanium (Ti)/tungsten (W) in the opening provided in the insulating film 17 in a CVD (Chemical Vapor Deposition) method, a PVD (Physical Vapor Deposition) method, an ALD (Atomic Layer Deposition) method, an evaporation method, or the like and then patterning this stacked film by using photolithography and etching. For example, the embedded layer 18 is formed by forming a film of an insulating material on the whole of the surface of the temporary substrate 33 to embed the semiconductor layer 10S and then planarizing this by CMP (Chemical Mechanical Polishing). This forms the embedded layer 18 that covers the region (peripheral region R2) around the semiconductor layer 10S and the upper surface (the surface farthest from the temporary substrate 33) of the semiconductor layer 10S.

After the embedded layer 18 is formed, the wiring layer 10W is formed that is opposed to the semiconductor layer 10S with the embedded layer 18 interposed in between as illustrated in FIG. 3M. For example, the interlayer insulating film 19A and the interlayer insulating film 19B are formed in this order on the embedded layer 18. After that, an opening is formed in the region of the interlayer insulating films 19A and 19B opposed to the first electrode 11. A copper (Cu) film is formed in this opening of the interlayer insulating films 19A and 19B in an evaporation method, a PVD method, a plating method, or the like. After that, the surface of the copper film is polished by using, for example, a CMP method. This forms the contact electrode 19E. For example, the dummy electrode 19ED (FIG. 1) is formed in the peripheral region R2 in the same step as the step of forming this contact electrode 19E.

After the wiring layer 10W is formed, the readout circuit substrate 20 is bonded to the temporary substrate 33 with the wiring layer 10W interposed in between as illustrated in FIG. 3N. In this case, the wiring layer 20W is formed in the readout circuit substrate 20 in advance. The wiring layer 20W of the readout circuit substrate 20 includes the contact electrode 22E and the dummy electrode 22ED. In a case where the readout circuit substrate 20 is bonded to the temporary substrate 33, for example, the contact electrode 22E and the dummy electrode 22ED of the wiring layer 20W and the contact electrode 19E and the dummy electrode 19ED of the wiring layer 10W are bonded by CuCu bonding. More specifically, the bonding surface S2 on which the contact electrode 19E and the contact electrode 22E are bonded is formed in the element region R1. The bonding surface S2 on which the dummy electrode 19ED and the dummy electrode 22ED are bonded is formed in the peripheral region R2. Here, the peripheral region R2 of the element substrate 10 is also bonded to the readout circuit substrate 20.

After the readout circuit substrate 20 is bonded to the temporary substrate 33, the temporary substrate 33 is removed as illustrated in FIG. 3O. It is possible to remove the temporary substrate 33 by using, for example, mechanical grinding, wet etching, dry etching, or the like.

After the temporary substrate 33 is removed, the adhesive layer B and the like are also removed to expose the surface of the semiconductor layer 10S as illustrated in FIG. 3P. An unnecessary layer of the semiconductor layer 10S may be then removed. In addition, a portion of the insulating layer 33IA or a portion of the insulating film 17 may be left unremoved in a region other than the opening of the semiconductor layer 10S or the embedded layer 18 may be dug halfway.

Subsequently, the second electrode 15 and the passivation film 16 are formed in this order on the surface (surface opposite to the surface on which the wiring layer 10W is provided) of the semiconductor layer 10S exposed by removing the temporary substrate 33 as illustrated in FIG. 3Q. After that, the opening H1 and the electrically conductive film 15B are formed as illustrated in FIG. 3R. This electrically couples the second electrode 15 and the readout circuit substrate 20.

Finally, the opening H2 is formed as illustrated in FIG. 3S. The opening H2 reaches the pad electrode 22P of the readout circuit substrate 20 through the element substrate 10. This completes the light receiving element 1 illustrated in FIG. 1.

1-3. Operation of Light Receiving Element

In a case where light (e.g., light having a wavelength in the visible region and the infrared region) enters the photoelectric conversion layer 14 through the passivation film 16, the second electrode 15, and the carrier transfer layer 13B in the light receiving element 1, this light is absorbed in the photoelectric conversion layer 14. This generates pairs of holes (holes) and electrons (photoelectrical conversion is performed) in the photoelectric conversion layer 14. For example, in a case where a predetermined voltage is then applied to the first electrode 11, a depletion layer extends between the convex section C in the first diffusion region 12A and the carrier transfer layer 13A including n-type InP and a high electric field region is formed. In the high electric field region, carriers are multiplied by avalanche multiplication. An electric charge (e.g., hole) that is one of the carriers (electric charges) generated in the high electric field region moves to the diffusion region 12X in the non-dope layer 12 as a signal charge and is collected from the diffusion region 12X to the first electrode 11. This signal charge moves to the semiconductor substrate 21 through the contact electrodes 19E and 22E and is read out for each of the pixels P.

1-4. Workings and Effects

In the light receiving element 1 according to the present embodiment, the surface of the semiconductor layer 10S (specifically, the non-dope layer 12) in contact with the first electrode 11 is provided with the diffusion region 12X that gradually changes in impurity concentration. For example, this relaxes the electric field in the lateral direction. The following describes this.

In the semiconductor device such as an avalanche photodiode (APD) or a PN photodiode, carriers are read out from the zinc (Zn) diffusion electrode. The semiconductor device described above has a uniform zinc distribution in the depth direction and the lateral direction of the semiconductor layer. The APD has an issue with a decrease in sensitivity caused by the generation of APD at the side wall portion of the zinc diffusion region. In addition, the PN photodiode has an issue with the generation of a dark current in a strong electric field.

In contrast, in the light receiving element 1 according to the present embodiment, the surface of the semiconductor layer 10S (specifically, the non-dope layer 12) in contact with the first electrode 11 is provided with the diffusion region 12X that gradually changes in impurity concentration. This diffusion region 12X has, for example, the first diffusion region 12A and the second diffusion region 12B having a lower impurity concentration than that of the first diffusion region 12A. The diffusion region 12X has a configuration in which the second diffusion region 12B is provided around the first diffusion region 12A. For example, this makes it possible to relax the electric field in the lateral direction.

In addition, in the present embodiment, the first diffusion region 12A has a diffusion shape with the inflection point X. The first diffusion region 12A includes the convex section C in the stacking direction (e.g., Z axis direction) of the semiconductor layer 10S. The convex section C penetrates the second diffusion region 12B. This makes it possible to concentrate the electric field on the convex section C.

As described above, in the light receiving element 1 according to the present embodiment, the generation of a dark current is suppressed that causes a decrease in sensitivity and causes noise.

In addition, in the present embodiment, the groove t is formed in the diffusion region 12X after the first diffusion of p-type impurities and p-type impurities are diffused again. This decreases the width of the diffusion region 12X in the XY plane direction. This allows the pixel size to decrease.

Further, in the present embodiment, a portion of the first electrode 11 is embedded and provided in the non-dope layer 12. This increases the contact area between the non-dope layer 12 and the first electrode 11 and decreases the contact resistance. This allows the transfer efficiency to increase.

The following describes a second embodiment, but the same components as the components of the first embodiment described above are denoted by the same signs in the following description and description thereof is omitted where appropriate.

2. Second Embodiment

FIG. 4 schematically illustrates a cross-sectional configuration of a light receiving element (light receiving element 2) according to a second embodiment of the present disclosure. FIG. 5 schematically illustrates a planar configuration of the light receiving element 2 illustrated in FIG. 4. It is to be noted that FIG. 4 illustrates a cross-sectional configuration taken along an II-IP line illustrated in FIG. 5. This light receiving element 2 is applied, for example, to an infrared sensor or the like including a compound semiconductor material such as a III-V group semiconductor. The light receiving element 2 is a PN photodiode that has a photoelectric conversion function, for example, for light having a wavelength in the visible region (e.g., 380 nm or more and less than 780 nm) to the short infrared region (e.g., 780 nm or more and less than 2400 nm).

2-1. Configuration of Light Receiving Element

The light receiving element 2 has, for example, the element region R1 at the middle portion and the peripheral region R2 provided outside the element region R1 and surrounding the element region R1 (FIG. 5). The light receiving element 2 has a stacked structure in which an element substrate 40 and the readout circuit substrate 20 are stacked as with the light receiving element 1 according to the first embodiment described above. The element substrate 40 has a light incidence surface (light incidence surface S3) and a bonding surface (bonding surface S4) that is opposed to the light incidence surface S3 and is bonded to the readout circuit substrate 20. The element substrate 40 includes the wiring layer 10W, a first electrode 41, a first contact layer 42, a photoelectric conversion layer 43 and a second contact layer 44, and a second electrode 45 in this order from positions closer to the readout circuit substrate 20. The first contact layer 42, the photoelectric conversion layer 43, and the second contact layer 44 are included, for example, in a semiconductor layer 40S common to the plurality of pixels P. There is provided a diffusion region 42X on a surface 42S2 of the first contact layer 42 for each of the pixels P. Impurities are diffused in the diffusion region 42X. In the light receiving element 2 according to the present embodiment, the diffusion region 42X has a first diffusion region 42A and a second diffusion region 42B having a lower impurity concentration than that of the first diffusion region 42A. The diffusion region 42X has a configuration in which the second diffusion region 42B is provided around the first diffusion region 42A. This first diffusion region 42A corresponds to a specific example of the "first impurity diffusion region" according the present disclosure and the second diffusion region 42B corresponds to a specific example of the "second impurity diffusion region" according to the present disclosure.

In the light receiving element 2, light enters the photoelectric conversion layer 43 from the light incidence surface S3 of the element substrate 40 through the passivation film 16, the second electrode 45, and the second contact layer 44. The signal charge photoelectrically converted in the photoelectric conversion layer 43 moves through the first electrode 41 and the wiring layer 10W and is read out by the readout circuit substrate 20. The following describes a configuration of each section.

The first electrode 41 is an electrode (anode) to be supplied with a voltage for reading out the signal charges (holes or electrons, but description is given below on the assumption that the signal charge is holes for the sake of convenience) generated in the first contact layer 42. The first electrode 41 is provided for each of the pixels P in the element region R1. The first electrode 41 is larger than an opening of the insulating film 17 and a portion of the first electrode 41 is provided in an embedded layer 18. In addition, a portion of the first electrode 41 protrudes to the first contact layer 42 side as with the first electrode 11 described above. In other words, the upper surface (surface on the semiconductor layer 40S side) of the first electrode 41 is in contact with the diffusion region 42X and a portion thereof is formed in the first contact layer 42. The lower surface and the side surfaces of the first electrode 41 are in contact with the embedded layer 18. The adjacent first electrodes 41 are electrically separated from each other by the insulating film 17 and the embedded layer 18.

The first electrode 41 includes, for example, any of titanium (Ti), tungsten (W), titanium nitride (TiN), platinum (Pt), gold (Au), germanium (Ge), palladium (Pd), zinc (Zn), nickel (Ni), and aluminum (Al) alone or alloy including at least one of them. The first electrode 41 may be a single film including such a material or may be a stacked film obtained by combining two or more of them. For example, the first electrode 41 includes the stacked film (Ti/W) of titanium and tungsten. The thickness of the first electrode 41 is, for example, several tens of nm to several hundreds of nm.

The semiconductor layer 40S includes, for example, the first contact layer 42, the photoelectric conversion layer 43, and the second contact layer 44 from the first electrode 41 side. The first contact layer 42, the photoelectric conversion layer 43, and the second contact layer 44 have the same planar shape and the respective end surfaces are disposed at the same position in a plan view.

The first contact layer 42 is provided, for example, to all of the pixels P in common and is disposed between the insulating film 17 and the photoelectric conversion layer 43. The first contact layer 42 is for electrically separating the adjacent pixels P from each other and the first contact layer 42 is provided, for example, with a plurality of diffusion regions 42X. The use of a compound semiconductor material having a band gap greater than the band gap of the compound semiconductor material included in the photoelectric conversion layer 43 for the first contact layer 42 makes it possible to suppress even a dark current. For example, it is possible to use n-type InP (indium phosphide) for the first contact layer 42.

The diffusion regions 42X provided to the first contact layer 42 are disposed apart from each other. Specifically, the diffusion regions 42X are disposed for the respective pixels P and the first electrode 41 is coupled to each of the diffusion regions 42X. The diffusion region 42X is for reading out the signal charges generated in the photoelectric conversion layer 43 for each of the pixels P. The diffusion region 42X includes, for example, a p-type impurity. Examples of the p-type impurity include zinc (Zn), magnesium (Mg), and the like. In this way, a pn bonding interface is formed between the diffusion region 42X and the first contact layer 42 other than the diffusion region 42X. The adjacent pixels P are electrically separated from each other.

In the present embodiment, the diffusion region 42X has a configuration in which the impurity concentration gradually changes. Specifically, the diffusion region 42X includes, for example, the first diffusion region 42A and the second diffusion region 42B having a lower impurity concentration than that of the first diffusion region 42A. The second diffusion region 42B is provided around the first diffusion region 42A. The first diffusion region 42A has, for example, an impurity concentration of 2E18 $cm^{-3}$ or more and 8E18 $cm^{-3}$ or less. The second diffusion region 42B has, for example, an impurity concentration of 1E17 $cm^{-3}$ or more and 2E18 $cm^{-3}$ or less.

FIG. 6 illustrates a cross-sectional configuration (B) of a diffusion region 420X and a region near the diffusion region 420X in a light receiving element serving as a reference example and having a diffusion region 420A in which impurities are uniformly distributed and a field strength change (A). FIG. 7 illustrates a cross-sectional configuration (B) of the diffusion region 42X and a region near the diffusion region 42X in the light receiving element 2 according to the present disclosure and a field strength change (A). The light receiving element 2 according to the present embodiment has the second diffusion region 42B around the first diffusion region 42A. The second diffusion region 42B has a lower impurity concentration than that of the first diffusion region 42A. The field strength change in the diffusion region 42X and the region near the diffusion region 42X is therefore less steep than that of the light receiving element serving as a reference example (FIG. 6).

In addition, the first diffusion region 42A has a diffusion shape with an inflection point X. For example, it is preferable that the first diffusion region 42A include the convex section C in the stacking direction (e.g., Z axis direction) of the respective layers 42, 43, and 44 included in the semiconductor layer 40S. This convex section C penetrates the second diffusion region 42B. In other words, the diffusion region 42X forms a gradual impurity concentration gradient in the horizontal direction (XY plane direction) and a steep impurity concentration gradient in the longitudinal direction (Z axis direction). Defects that cause a dark current are dominant on the surface of the first contact layer 42. In contrast, the first diffusion region 42A is shaped as described above. This concentrates the electric field on the convex section C and relaxes the electric field in the diffusion region 42X in the lateral direction. The probability is reduced that a dark current is generated through the defects on the surface of the first contact layer 42.

Further, it is preferable that a portion of the diffusion region 42X be provided to protrude in a portion of the thickness direction of the photoelectric conversion layer 43. In other words, it is desirable that the tip of the convex section C in the first diffusion region 42A be in the photoelectric conversion layer 43. A dark current from a depletion layer formed in an InGaAs layer having a small band gap from an impurity (e.g., Zn) diffusion region is dominant in the crystals. In contrast, in the present embodiment, the convex section C is provided in the first diffusion region 42A and the tip thereof is in the photoelectric conversion layer 43. This causes the impurity diffusion region (first diffusion region 42A) and the InGaAs layer (photoelectric conversion layer 43) to have the minimum contact portion. The probability is further reduced that a dark current is generated.

The diffusion region 42X is provided with the groove t in the first diffusion region 42A as with the diffusion region 12X according to the first embodiment described above. The first electrode 41 is embedded and provided in this groove t.

The photoelectric conversion layer 43 is provided, for example, to all of the pixels P in common. This photoelectric conversion layer 43 is provided between the first contact layer 42 and the second contact layer 44 and is in contact with them. The photoelectric conversion layer 43 absorbs light having a predetermined wavelength to generate signal charges. The photoelectric conversion layer 43 includes, for example, a compound semiconductor material such as an i-type III-V group semiconductor. Examples of the compound semiconductor material included in the photoelectric conversion layer 43 include InGaAs (indium gallium arsenide), InAsSb (indium arsenide antimony), InAs (indium arsenide), InSb (indium antimony), HgCdTe (mercury cadmium tellurium), and the like. The photoelectric conversion layer 43 may include Ge (germanium). The photoelectric conversion layer 43 photoelectrically converts, for example, light having a wavelength in the visible region to the short infrared region.

The second contact layer 44 is provided, for example, to all of the pixels P in common. This second contact layer 44 is provided between the photoelectric conversion layer 43 and the second electrode 45. The second contact layer 44 is in contact with them. The second contact layer 44 is a region through which the electric charges discharged from the second electrode 45 move. The second contact layer 44 includes, for example, a compound semiconductor including an n-type impurity. For example, it is possible to use n-type InP (indium phosphide) for the second contact layer 44.

The second electrode 45 is provided, for example, on the second contact layer 44 (light incidence side) as an electrode common to each of the pixels P to come into contact with the second contact layer 44. The second electrode 45 is for discharging electric charges that are not used as signal charges among the electric charges generated in the photoelectric conversion layer 43 (cathode). For example, in a case where holes are read out from the first electrode 41 as signal charges, it is possible to discharge, for example, electrons through this second electrode 45. The second electrode 45 includes, for example, an electrically conducive film that is able to transmit incident light such as an infrared ray. It is possible to use, for example, ITO, ITiO (In$_2$O$_3$—TiO$_2$), or the like for the second electrode 45. The second electrodes 45 may be provided, for example, in a lattice shape to partition the adjacent pixels P. In that case, it is possible to use an electrically conductive material having low light transmissivity.

2-1. Method of Manufacturing Light Receiving Element

It is possible to manufacture the light receiving element 2, for example, as follows. FIGS. 8A to 8K illustrate steps of manufacturing the light receiving element 1 in the order of steps.

First, as illustrated in FIG. 8A, for example, a buffer layer 52B including n-type InP, a stopper layer 52S including i-type InGaAs, the semiconductor layer 40S, and a cap layer 45A including i-type InGaAs are subjected to epitaxial growth in this order on a growth substrate 51 including, for example, InP. The thickness of the growth substrate 51 is, for example, several hundreds of μm and the thickness of the semiconductor layer 40S is, for example, several μm. After that, the adhesive layer B is formed on the semiconductor layer 40S. The bore of the growth substrate 51 is, for example, six inches or less. The semiconductor layer 40S is formed, for example, by subjecting n-type InP included in the first contact layer 42, n-type InGaAs included in the photoelectric conversion layer 43, and n-type InP included in the second contact layer 44 to epitaxial growth in this order.

Next, as illustrated in FIG. 8B, the growth substrate 51 on which the semiconductor layer 40S is formed is bonded to a temporary substrate 53 with the adhesive layer B interposed in between. The temporary substrate 53 includes, for example, an insulating layer (insulating layer 53IA) and a substrate 53S. The insulating layer 53IA is disposed, for example, between the adhesive layer B and the substrate 53S. A substrate having a bore larger than that of the growth substrate 51 is used for the temporary substrate 53. For example, a silicon (Si) substrate is used for the substrate 53S. The bore of the temporary substrate 53 is, for example, eight inches to twelve inches. Bonding the growth substrate 51 having a small bore to the temporary substrate 53 having a large bore allows a variety of devices for a substrate having a large bore to be used in a case where the element substrate 40 is formed. This allows CuCu bonding to be used, for example, as the bonding between the readout circuit substrate 20 and the element substrate 40 and allows the pixels P to be finer. The growth substrate 51 may be bonded to the temporary substrate 53 by plasma-activated bonding, normal temperature bonding, bonding with an adhesive (adhesive bonding), or the like. In this way, for example, the wafer-shaped semiconductor layer 40S is bonded to the temporary substrate 53. The thickness of the temporary substrate 53 is, for example, several hundreds of μm.

Subsequently, as illustrated in FIG. 8C, the growth substrate 51 including the buffer layer 52B and the stopper layer 52S is removed. It is possible to remove the growth substrate 51 by mechanical grinding, CMP, wet etching, dry etching, or the like. A portion of the growth substrate 51 may be then left unremoved. In addition, a portion of the semiconductor layer 40S may be etched.

Next, as illustrated in FIG. 8D, for example, the semiconductor layer 40S is etched to a predetermined size in accordance with a mark of the temporary substrate 53. This forms the semiconductor layer 40S in the state of a plurality of chips.

Subsequently, as illustrated in FIGS. 8E to 8J, the diffusion region 42X is formed on the semiconductor layer 40S for each of the pixels P. It is to be noted that each of FIGS. 8E to 8J is an enlarged view of the one pixel P.

First, as illustrated in FIG. 8E, the SiO$_2$ film 35 and the SiN film 36 are formed in this order as a hard mask on the semiconductor layer 40S. Next, the photoresist 37 is formed on the SiN film 36 and an opening h4 is formed that extends through the photoresist 37 and the SiN film 36. Subsequently, as illustrated in FIG. 8F, the photoresist 37 is removed by wet etching, dry etching, or the like and an opening h5 is formed that extends through the SiO$_2$ film 35. It is to be noted that the hard mask is not limited to the stacked film of the SiO$_2$ film/the SiN film described above as in the first embodiment described above. For example, the hard mask may be the single layer film of the SiO$_2$ film or the SiN film.

Next, as illustrated in FIG. 8G, p-type impurities (e.g., zinc (Zn)) are diffused to form a diffusion region 42A1. Impurities are diffused by using, for example, diethylzinc (DEZ) gas or dimethylzinc (DMZ) gas as gas phase diffusion under a condition of 200° C. to 600° C. It is preferable that the diffusion depth be, for example, 100 nm to 300 nm with respect to the film thickness (e.g., 300 nm) of the first contact layer 42. Impurities are substantially isotropically diffused from a surface 42S of the first contact layer 42 to form the substantially hemispherical diffusion region 42A1. Subsequently, as illustrated in FIG. 8H, the sidewall 38 is formed in the opening h5 and on the SiN film 36 and an opening h6 is then formed in the opening h5. The sidewall 38 includes, for example, silicon nitride (SiN), silicon oxide ($SiO_2$), aluminum oxide ($Al_2O_3$), tantalum oxide ($Ta_2O_5$), SiC, SiCO, or the like. The opening h6 extends into the diffusion region 42A1. This opening h6 corresponds to the groove t described above. After the opening h6 is formed, annealing treatment is performed. This diffuses p-type impurity around the diffusion region 42A1 as illustrated in FIG. 8I and forms the second diffusion region 42B that has a lower impurity concentration than that of the diffusion region 42A1 and has a substantially hemispherical shape as with the diffusion region 42A1. Next, p-type impurities are subjected again to gas phase diffusion through the opening h6 to form a diffusion region 42A2 corresponding to the convex section C in the first diffusion region 42A. It is preferable that the diffusion depth be, for example, 5 nm or more shorter in distance than that of the first Zn diffusion. The p-type impurities are substantially isotropically diffused. The ratio (first/second) between the distance of first diffusion and the distance of the second diffusion is, for example, less than 1. It is possible to adjust the target distance that is determined after the second diffusion in accordance with the digging depth of the opening h6. This forms the first diffusion region 42A having a diffusion shape with the inflection point X.

Subsequently, as illustrated in FIG. 8K, the insulating film 17 is formed around the semiconductor layer 40S by using, for example, silicon oxide ($SiO_2$). It is to be noted that the $SiO_2$ film 35 and the SiN film 36 do not necessarily have to be removed as in the first embodiment described above. These may be used as the insulating film 17. Thereafter, the light receiving element 2 illustrated in FIG. 4 is completed through steps similar to those of the first embodiment described above.

2-3. Operation of Light Receiving Element

In a case where light (e.g., light having a wavelength in the visible region and the infrared region) enters the photoelectric conversion layer 43 through the passivation film 16, the second electrode 45, and the second contact layer 44 in the light receiving element 2, this light is absorbed in the photoelectric conversion layer 43. This generates pairs of holes (holes) and electrons (photoelectrical conversion is performed) in the photoelectric conversion layer 43. For example, in a case where a predetermined voltage is then applied to the first electrode 41, a potential gradient occurs in the photoelectric conversion layer 43. One (e.g., hole) of the generated electric charges moves to the diffusion region 42X as a signal charge and is collected from the diffusion region 42X to the first electrode 41. This signal charge moves to the semiconductor substrate 21 through the contact electrodes 19E and 22E and is read out for each of the pixels P.

2-4. Workings and Effects

In the light receiving element 2 according to the present embodiment, the surface of the semiconductor layer 40S (specifically, the first contact layer 42) in contact with the first electrode 41 is provided with the diffusion region 42X that gradually changes in impurity concentration. This diffusion region 42X has, for example, the first diffusion region 42A and the second diffusion region 42B having a lower impurity concentration than that of the first diffusion region 42A. The diffusion region 42X has a configuration in which the second diffusion region 42B is provided around the first diffusion region 42A. For example, this relaxes the electric field in the lateral direction.

In addition, in the present embodiment, the first diffusion region 42A has a diffusion shape with the inflection point X. The first diffusion region 42A includes the convex section C in the stacking direction (e.g., Z axis direction) of the semiconductor layer 40S. The convex section C penetrates the second diffusion region 42B. This makes it possible to concentrate the electric field on the convex section C.

As described above, in the light receiving element 2 according to the present embodiment, it is possible to suppress the generation of a dark current that causes noise as in the first embodiment described above.

In addition, in the present embodiment, the groove t is formed in the diffusion region 42X after the first diffusion of p-type impurities and p-type impurities are diffused again. This decreases the width of the diffusion region 42X in the XY plane direction. This allows the pixel size to decrease.

Further, in the present embodiment, the first electrode 41 is embedded and provided in the groove t. This increases the contact area between the first contact layer 42 and the first electrode 41 and decreases the contact resistance. This allows the transfer efficiency to increase.

3. Application Examples

Application Example 1

The light receiving element 1 (or the light receiving element 2) described in the embodiment or the like described above is applied, for example, to an imaging device. This imaging device is, for example, an infrared image sensor.

Application Example 2

Each of the light receiving elements 1 and 2 described above is applicable, for example, to various types of electronic apparatuses (imaging apparatuses) such as a camera that is able to capture an image in the infrared region. FIG. 9 illustrates a schematic configuration of an electronic apparatus 3 as an example thereof. This electronic apparatus 3 is, for example, a camera that is able to shoot a still image or a moving image. The electronic apparatus 3 includes, for example, an imaging device 4 including, for example, the light receiving element 1, an optical system (optical lens) 310, a shutter device 311, a driver 313, and a signal processor 312. The driver 313 drives the imaging device 4 and the shutter device 311.

The optical system 310 guides image light (incident light) from a subject to the imaging device 4. This optical system 310 may include a plurality of optical lenses. The shutter device 311 controls a period in which the imaging device 4 is irradiated with light and a period in which light is blocked. The driver 313 controls a transfer operation of the imaging device 4 and a shutter operation of the shutter device 311. The signal processor 312 performs various kinds of signal processing on a signal outputted from the imaging device 4. An image signal Dout subjected to the signal processing is stored in a storage medium such as a memory or outputted to a monitor or the like.

Further, the light receiving element 1 or 2 described in the present embodiment or the like is also applicable to the following electronic apparatuses (a capsule endoscope and a mobile body such as a vehicle).

4. Practical Application Examples

Practical Application Example 1. Endoscopic Surgery System

The technology according to the present disclosure is applicable to a variety of products. For example, the technology according to the present disclosure may be applied to an endoscopic surgery system.

FIG. 10 is a view depicting an example of a schematic configuration of an endoscopic surgery system to which the technology according to an embodiment of the present disclosure (present technology) can be applied.

In FIG. 10, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 11 is a block diagram depicting an example of a functional configuration of the camera head 11102 and the CCU 11201 depicted in FIG. 10.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be applied to the image pickup unit 11402 among the components described above. The application of the technology according to the present disclosure to the image pickup unit 11402 makes it possible to obtain a clearer image of a surgical region. This allows a surgeon to check the surgical region with certainty.

It is to be noted that the endoscopic surgery system has been described here as an example, but the technology according to the present disclosure may be additionally applied, for example, to a microscopic surgery system or the like.

Practical Application Example 2. Mobile Body

The technology according to the present disclosure is applicable to a variety of products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a vessel, or a robot.

FIG. 12 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display.

FIG. 13 is a diagram depicting an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the components described above. The application of the technology according to the present disclosure to the imaging section 12031 makes it possible to obtain a shot image that is easier to see. This makes it possible to decrease the fatigue of a driver.

Further, the light receiving element 1 or 2 described in the present embodiment or the like is also applicable to electronic apparatuses such as a surveillance camera, a biometric authentication system, and a thermograph. Examples of the surveillance camera include a night vision system (night scope). The application of the light receiving element 1 or the light receiving element 2 to the surveillance camera makes it possible to recognize a pedestrian and an animal at night from a distance. In addition, the application of the light receiving element 1 or the light receiving element 2 as an onboard camera reduces the influence from a headlight or weather. For example, it is possible to obtain a shot image without being influenced by smoke, fog, or the like. Further, it is also possible to recognize the shape of an object. In addition, the thermograph allows for contactless temperature measurement. The thermograph also allows temperature distribution and heat generation to be detected. In addition, each of the light receiving elements 1 and 2 is also applicable to an electronic apparatus that detects fire, moisture, gas, or the like.

Although description has been made above with reference to the first and second embodiments, the application examples, and the practical application examples, the contents of the present disclosure are not limited to the embodiment or the like described above. It is possible to make a variety of modifications. For example, the layer configuration of each of the light receiving elements 1 and 2 described in the embodiments described above is an example and other layers may be further included. In addition, the material and the thickness of each of the layers are also examples. Those described above are not limitative. For example, in the second embodiment described above, the case has been described where the semiconductor layer 40S includes the first contact layer 42, the photoelectric conversion layer 43, and the second contact layer 44, but it is sufficient if the semiconductor layer 10S includes the photoelectric conversion layer 43. For example, the first contact layer 42 and the second contact layer 44 do not also have to be provided. Alternatively, other layers may also be included.

Further, in the embodiment or the like described above, the example has been described in which the element substrate (e.g., element substrate 10) and the readout circuit substrate 20 are bonded by CuCu bonding. The element substrate (e.g., element substrate 10) and the readout circuit substrate 20 may be, however, bonded, for example, through a bump.

Still further, in the embodiment or the like described above, the case has been described where the signal charges are holes for the sake of convenience. The signal charges may also be electrons. For example, the diffusion region may include an n-type impurity.

In addition, the light receiving element has been described in the embodiment or the like described above. The light receiving element is a specific example of the semiconductor element according to the present technology. The semiconductor element according to the present technology does not, however, have to be the light receiving element. For example, the semiconductor element according to the present technology may be a light emitting element.

In addition, the effects described in the embodiment or the like described above are examples. The effects may be other effects or may further include other effects.

It is to be noted that the present technology may also have configurations as follows. The present technology having the following configurations provides on one surface of a semiconductor layer including a compound semiconductor material with an impurity diffusion region that gradually changes in impurity concentration. This makes it possible to relax the electric field in the lateral direction. This makes it possible to reduce a dark current.

(1)

A light receiving element including:

a semiconductor layer including a compound semiconductor material;

a first impurity diffusion region provided on one surface of the semiconductor layer; and a second impurity diffusion region provided around the first impurity diffusion region, the second impurity diffusion region having a lower impurity concentration than an impurity concentration of the first impurity diffusion region.

(2)

The light receiving element according to (1), in which the first impurity diffusion region has a diffusion shape with an inflection point.

(3)

The light receiving element according to (1) or (2), in which the first impurity diffusion region includes a convex section that penetrates the second impurity diffusion region.

(4)

The light receiving element according to any of (1) to (3), further including:

a first electrode provided on the one surface side of the semiconductor layer, the first electrode being electrically coupled to the semiconductor layer; and a second electrode opposed to the first electrode with the semiconductor layer interposed between the second electrode and the first electrode.

(5)

The light receiving element according to (4), in which the semiconductor layer has a groove in the first impurity diffusion region, and a portion of the first electrode is embedded and provided in the groove.

(6)

The light receiving element according to any of (1) to (5), in which the semiconductor layer includes a first semiconductor layer and a second semiconductor layer that are stacked in order from the one surface side, the first semiconductor layer and the second semiconductor layer having different electrical conduction types or including different materials, and the first impurity diffusion region and the second impurity diffusion region are provided to the first semiconductor layer.

(7)

The light receiving element according to (6), in which the first impurity diffusion region includes a convex section that penetrates the second impurity diffusion region, and the convex section is formed in the first semiconductor layer.

(8)

The light receiving element according to (6), in which the first impurity diffusion region includes a convex section that penetrates the second impurity diffusion region, and a portion of the convex section protrudes into the second semiconductor layer.

(9)

The light receiving element according to any of (1) to (8), in which zinc (Zn) is diffused in the first impurity diffusion region and the second impurity diffusion region.

(10)

The light receiving element according to any of (1) to (9), in which the compound semiconductor material absorbs light having a wavelength in an infrared region.

(11)

The light receiving element according to any of (1) to (10), in which the compound semiconductor material includes a III-V group semiconductor.

(12)

The light receiving element according to any of (1) to (11), in which the compound semiconductor material includes any one of InGaAs, InAsSb, InAs, InSb, and HgCdTe.

(13)
The light receiving element according to any of (1) to (12), in which the semiconductor layer has a multi quantum well structure.

(14)
An imaging apparatus including
an element region in which a plurality of light receiving elements is disposed in an array, in which
the light receiving elements each include
a semiconductor layer including a compound semiconductor material,
a first impurity diffusion region provided on one surface of the semiconductor layer, and
a second impurity diffusion region provided around the first impurity diffusion region, the second impurity diffusion region having a lower impurity concentration than an impurity concentration of the first impurity diffusion region.

(15)
A method of manufacturing a light receiving element, the method including:
forming a semiconductor layer including a compound semiconductor material;
forming a mask layer having an opening on one surface of the semiconductor layer;
forming a first impurity diffusion region on the one surface of the semiconductor layer by diffusing an impurity through the opening; and
forming a second impurity diffusion region around the first impurity diffusion region through annealing treatment, the second impurity diffusion region having a lower impurity concentration than an impurity concentration of the first impurity diffusion region.

(16)
The method of manufacturing the light receiving element according to (15), in which
a sidewall is formed in the opening,
a groove is formed in the first impurity diffusion region by etching, and
the first impurity diffusion region is formed into a diffusion shape by diffusing an impurity again in the first impurity diffusion region through the groove after the annealing treatment, the diffusion shape having an inflection point.

(17)
The method of manufacturing the light receiving element according to (16), in which a metal material is embedded and provided in the groove to form a first electrode, the first electrode being electrically coupled to the light receiving element.

This application claims the priority on the basis of Japanese Patent Application No. 2019-052687 filed with Japan Patent Office on Mar. 20, 2019, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light receiving element comprising:
a semiconductor layer including a compound semiconductor material;
a first impurity diffusion region provided on one surface of the semiconductor layer;
a second impurity diffusion region provided around the first impurity diffusion region, the second impurity diffusion region having a lower impurity concentration than an impurity concentration of the first impurity diffusion region;
a first electrode provided on the one surface side of the semiconductor layer, the first electrode being electrically coupled to the semiconductor layer; and
a second electrode opposed to the first electrode with the semiconductor layer interposed between the second electrode and the first electrode, wherein
the semiconductor layer has a groove in the first impurity diffusion region, and
a portion of the first electrode is embedded and provided in the groove.

2. The light receiving element according to claim 1, wherein the first impurity diffusion region has a diffusion shape with an inflection point.

3. The light receiving element according to claim 1, wherein the first impurity diffusion region includes a convex section that penetrates the second impurity diffusion region.

4. A light receiving element comprising:
a semiconductor layer including a compound semiconductor material;
a first impurity diffusion region provided on one surface of the semiconductor layer; and
a second impurity diffusion region provided around the first impurity diffusion region, the second impurity diffusion region having a lower impurity concentration than an impurity concentration of the first impurity diffusion region, wherein
the semiconductor layer includes a first semiconductor layer and a second semiconductor layer that are stacked in order from the one surface side, the first semiconductor layer and the second semiconductor layer having different electrical conduction types or including different materials,
the first impurity diffusion region and the second impurity diffusion region are provided to the first semiconductor layer,
the first impurity diffusion region includes a convex section that penetrates the second impurity diffusion region, and
the convex section is formed in the first semiconductor layer.

5. A light receiving element comprising:
a semiconductor layer including a compound semiconductor material;
a first impurity diffusion region provided on one surface of the semiconductor layer; and
a second impurity diffusion region provided around the first impurity diffusion region, the second impurity diffusion region having a lower impurity concentration than an impurity concentration of the first impurity diffusion region, wherein
the semiconductor layer includes a first semiconductor layer and a second semiconductor layer that are stacked in order from the one surface side, the first semiconductor layer and the second semiconductor layer having different electrical conduction types or including different materials,
the first impurity diffusion region and the second impurity diffusion region are provided to the first semiconductor layer,
the first impurity diffusion region includes a convex section that penetrates the second impurity diffusion region, and
a portion of the convex section protrudes into the second semiconductor layer.

6. A light receiving element comprising:
- a semiconductor layer including a compound semiconductor material;
- a first impurity diffusion region provided on one surface of the semiconductor layer; and
- a second impurity diffusion region provided around the first impurity diffusion region, the second impurity diffusion region having a lower impurity concentration than an impurity concentration of the first impurity diffusion region, wherein zinc (Zn) is diffused in the first impurity diffusion region and the second impurity diffusion region.

7. The light receiving element according to claim 1, wherein the compound semiconductor material absorbs light having a wavelength in an infrared region.

8. The light receiving element according to claim 1, wherein the compound semiconductor material includes a III-V group semiconductor.

9. The light receiving element according to claim 1, wherein the compound semiconductor material includes any one of InGaAs, InAsSb, InAs, InSb, and HgCdTe.

10. The light receiving element according to claim 1, wherein the semiconductor layer has a multi quantum well structure.

11. An imaging apparatus comprising
an element region in which a plurality of light receiving elements is disposed in an array, wherein
the light receiving elements each include
- a semiconductor layer including a compound semiconductor material,
- a first impurity diffusion region provided on one surface of the semiconductor layer, and
- a second impurity diffusion region provided around the first impurity diffusion region, the second impurity diffusion region having a lower impurity concentration than an impurity concentration of the first impurity diffusion region;
- a first electrode provided on the one surface side of the semiconductor layer, the first electrode being electrically coupled to the semiconductor layer; and
- a second electrode opposed to the first electrode with the semiconductor layer interposed between the second electrode and the first electrode, wherein
the semiconductor layer has a groove in the first impurity diffusion region, and
  - a portion of the first electrode is embedded and provided in the groove.

12. A method of manufacturing a light receiving element, the method comprising:
- forming a semiconductor layer including a compound semiconductor material;
- forming a mask layer having an opening on one surface of the semiconductor layer;
- forming a first impurity diffusion region on the one surface of the semiconductor layer by diffusing an impurity through the opening; and
- forming a second impurity diffusion region around the first impurity diffusion region through annealing treatment, the second impurity diffusion region having a lower impurity concentration than an impurity concentration of the first impurity diffusion region, wherein
a sidewall is formed in the opening,
a groove is formed in the first impurity diffusion region by etching, and
the first impurity diffusion region is formed into a diffusion shape by diffusing an impurity again in the first impurity diffusion region through the groove after the annealing treatment, the diffusion shape having an inflection point.

13. The method of manufacturing the light receiving element according to claim 12, wherein a metal material is embedded and provided in the groove to form a first electrode, the first electrode being electrically coupled to the light receiving element.

14. An imaging apparatus comprising
an element region in which a plurality of light receiving elements is disposed in an array, wherein
the light receiving elements each include
- a semiconductor layer including a compound semiconductor material,
- a first impurity diffusion region provided on one surface of the semiconductor layer, and
- a second impurity diffusion region provided around the first impurity diffusion region, the second impurity diffusion region having a lower impurity concentration than an impurity concentration of the first impurity diffusion region, wherein
the semiconductor layer includes a first semiconductor layer and a second semiconductor layer that are stacked in order from the one surface side, the first semiconductor layer and the second semiconductor layer having different electrical conduction types or including different materials,
the first impurity diffusion region and the second impurity diffusion region are provided to the first semiconductor layer,
the first impurity diffusion region includes a convex section that penetrates the second impurity diffusion region, and
the convex section is formed in the first semiconductor layer.

15. An imaging apparatus comprising
an element region in which a plurality of light receiving elements is disposed in an array, wherein
the light receiving elements each include
- a semiconductor layer including a compound semiconductor material,
- a first impurity diffusion region provided on one surface of the semiconductor layer, and
- a second impurity diffusion region provided around the first impurity diffusion region, the second impurity diffusion region having a lower impurity concentration than an impurity concentration of the first impurity diffusion region, wherein
the semiconductor layer includes a first semiconductor layer and a second semiconductor layer that are stacked in order from the one surface side, the first semiconductor layer and the second semiconductor layer having different electrical conduction types or including different materials,
the first impurity diffusion region and the second impurity diffusion region are provided to the first semiconductor layer,
the first impurity diffusion region includes a convex section that penetrates the second impurity diffusion region, and
a portion of the convex section protrudes into the second semiconductor layer.

16. An imaging apparatus comprising
an element region in which a plurality of light receiving elements is disposed in an array, wherein
the light receiving elements each include a semiconductor layer including a compound semiconductor material,
a first impurity diffusion region provided on one surface of the semiconductor layer, and
a second impurity diffusion region provided around the first impurity diffusion region, the second impurity diffusion region having a lower impurity concentration than an impurity concentration of the first impurity diffusion region, and
wherein zinc (Zn) is diffused in the first impurity diffusion region and the second impurity diffusion region.

* * * * *